US012593480B2

(12) United States Patent (10) Patent No.: US 12,593,480 B2
Kurzmann et al. (45) Date of Patent: Mar. 31, 2026

(54) CELL DESIGN FOR MOS-CONTROLLED POWER SEMICONDUCTOR DEVICE

(71) Applicant: Infineon Technologies AG, Neubiberg (DE)

(72) Inventors: Thomas Kurzmann, Villach (AT); Christian Philipp Sandow, Haar (DE); Thomas Soellradl, Feldkirchen (AT)

(73) Assignee: Infineon Technologies AG, Neubiberg (DE)

( * ) Notice: Subject to any disclaimer, the term of this patent is extended or adjusted under 35 U.S.C. 154(b) by 867 days.

(21) Appl. No.: 17/706,806

(22) Filed: Mar. 29, 2022

(65) Prior Publication Data

US 2022/0320287 A1     Oct. 6, 2022

(30) Foreign Application Priority Data

Mar. 30, 2021     (DE) .......................... 102021107975.6

(51) Int. Cl.
| | |
|---|---|
| *H01L 29/732* | (2006.01) |
| *H10D 12/00* | (2025.01) |
| *H10D 62/10* | (2025.01) |
| *H10D 62/17* | (2025.01) |

(52) U.S. Cl.
CPC ......... *H10D 62/127* (2025.01); *H10D 12/481* (2025.01); *H10D 62/393* (2025.01)

(58) Field of Classification Search
None
See application file for complete search history.

(56) References Cited

U.S. PATENT DOCUMENTS

| | | | |
|---|---|---|---|
| 2013/0341673 A1 | 12/2013 | Pfirsch et al. | |
| 2017/0110535 A1 | 4/2017 | Yilmaz | |
| 2019/0123185 A1* | 4/2019 | Vellei | ............... H01L 21/26506 |

FOREIGN PATENT DOCUMENTS

| | | |
|---|---|---|
| CN | 210984733 U | 7/2020 |

* cited by examiner

*Primary Examiner* — Hung K Vu

(74) *Attorney, Agent, or Firm* — Murphy, Bilak & Homiller, PLLC

(57) ABSTRACT

An IGBT includes a drift region of a first conductivity type, a plurality of trenches laterally confining both first type mesas having a respective source region and a respective body region and second type mesas. A shield region does for example not laterally overlap with the second type mesa, but only with the first type mesa.

12 Claims, 20 Drawing Sheets

CELL DESIGN FOR MOS-CONTROLLED POWER SEMICONDUCTOR DEVICE

TECHNICAL FIELD

This specification refers to embodiments of a power semiconductor device and to embodiments of a method of producing a power semiconductor device. For example, this specification relates to embodiments of an IGBT or another MOS-controlled power semiconductor device where a shield region of a conductivity type complementary to the conductivity type of a drift region is provided in proximity to the MOS-based control section in accordance with a specific spatial configuration.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state.

Often, the gate electrode may be included within a trench of the power semiconductor device, wherein the trench may exhibit a stripe, needle/columnar, or quadratic/rectangular/hexagonal/polygonal configuration.

Two adjacent trenches laterally confine a portion of the semiconductor body typically referred to as mesa or mesa portion. If one of the trenches is a control trench, such mesa is typically configured for providing a path of the forward load current, e.g., by including a source region and a body region electrically connected to one of the load terminals. To this end, an inversion channel may be induced in the mesa's body region in order to allow for load current conduction.

During switching operations, were short overcurrent situations may occur, the bottoms of trenches having control electrodes may be subjected to high electric fields, which could jeopardize correct functionality of the device.

SUMMARY

According to an embodiment, a power semiconductor device comprises: a first load terminal at a first side, a second load terminal and, coupled to the first load terminal and the second load terminal, a semiconductor body configured for conducting a load current between the first load terminal and the second load terminal and having a drift region of a first conductivity type; a plurality of trenches at the first side and extending into the semiconductor body along a vertical direction. Each trench includes a trench electrode insulated from the semiconductor body by a trench insulator. Two of the plurality of trenches, also referred to as control trenches, are arranged laterally adjacent to each other and spatially confine a first type mesa, wherein the first type mesa is configured for conducting a part of the load current between the first load terminal and the drift region. Other two of the plurality of trenches, also referred to as exposed trenches, are arranged laterally adjacent to each other and spatially confine a second type mesa configured for not conducting an inversion channel current; the second type mesa being arranged spatially separated from the first type mesa by a spacer region. The power semiconductor device further comprises a source region of the first conductivity type in at least the first type mesa; a body region of a second conductivity type in at least the first type mesa, the body region separating the source region from the drift region; separate from the body region, a shield region of the second conductivity type extending: at least partially further along the vertical direction than bottoms of some of the trenches, wherein bottoms of at least the control trenches extend at least partially into the shield region; so as to form at least a partial lateral overlap with the first type mesa, said partial overlap with the first type mesa being greater as compared to an overlap with the second type mesa. E.g., the shield region is configured in a way to have less or no overlap with the second type mesa when compared to the first type mesa. The second load terminal may be arranged at a second side of the semiconductor body, wherein the second side may be opposite to the first side. For example, the spacer region may have a lateral width within a range of 30% to 300% of the lateral width of the first type mesa. The second type mesa may be configured for not forming an inversion channel.

According to another embodiment, a power semiconductor device comprises: a first load terminal at a first side, a second load terminal and, coupled to the first load terminal and the second load terminal, a semiconductor body configured for conducting a load current between the first load terminal and the second load terminal and having a drift region of a first conductivity type; a plurality of trenches at the first side and extending into the semiconductor body along a vertical direction. Each trench includes a trench electrode insulated from the semiconductor body by a trench insulator. Two of the plurality of trenches are arranged laterally adjacent to each other and spatially confine a first type mesa, wherein the first type mesa is configured for conducting a part of the load current between the first load terminal and the drift region. Other two of the plurality of trenches are arranged laterally adjacent to each other and spatially confine a second type mesa configured for not conducting an inversion channel current, the second type mesa being arranged spatially separated from the first type mesa and electrically connected with the first load terminal. A dummy mesa is laterally confined by yet other two of the plurality of trenches and arranged between two of the second type mesas. The dummy mesa is electrically insulated from the first load terminal and has a lateral width of at least 110%, or even of at least 150% of the lateral width of the first type mesa. The lateral width of the dummy mesa may optionally not exceed 400% of the lateral width of the first type mesa. In another example, the lateral width of the dummy mesa may not exceed 200% of the lateral width of the first type mesa. The power semiconductor device further has a source region of the first conductivity type in at least the first type mesa, and a body region of a second conductivity type in at least the first type mesa, the body region separating the source region from the drift region. The second load terminal may be arranged at a second side of the semiconductor body, wherein the second side may be opposite to the first side. The second type mesa may be configured for not forming an inversion channel.

A dummy mesa region may comprise the dummy mesa and one or two of the trenches confining the respective dummy mesa. According to another embodiment, a pitch of a dummy mesa region may be greater than a pitch of other (active) regions of the power semiconductor device. More specifically, the pitch of the dummy mesa region may be greater than a pitch of first type mesa region or first type mesa regions. For example, the dummy mesa region may have a pitch of at least 110% or at least 150% of the pitch of the first type mesa regions. The first type mesa region may comprise the first type mesa and one or two of the trenches confining the respective first type mesa. A distance between the trenches confining two second type mesas between which the dummy mesa is arranged is bigger than a distance of the trenches confining two adjacent first type mesas. More general, the distance between two neighboring trenches may be greater in the dummy mesa region than in the first type mesa regions, for example by at least 110% or at least 150%.

A trench density may be lower in the dummy mesa region than in other (active) regions of the power semiconductor device. This lower trench density may be a result of the greater distance of the trenches. The higher density of the trenches in the first type mesa regions may provide a shielding effect against an electric field. In other words, as a result of the trench density, the trenches shield each other in the first type mesa regions. Due to the lower trench density in the dummy mesa region or the greater distance of the trenches in the dummy mesa region respectively, the trenches in the dummy mesa region are less shielded or more exposed. Therefore, the trenches in the dummy mesa region may also referred to as exposed trenches. This leads to a higher avalanche probability in the dummy mesa region.

According to another embodiment, a trench IGBT comprises a drift region of a first conductivity type; a plurality of trenches laterally confining both first type mesas having a respective source region and a respective body region and second type mesas, the plurality of trenches extending into an inactive cell section and into an active cell section of the IGBT. Both the inactive cell section and the active cell section are arranged in an active region of the IGBT and are separated from each other by at least one spacer region. A portion of bottoms of the trenches of the active cell section are separated from the drift region by a shield region of a second conductivity type. A portion of bottoms of the trenches of the inactive cell section are in direct contact with the drift region. The trenches of the active cell section are also referred to as control trenches. The trenches of the inactive cell section are also referred to as exposed trenches.

According to another embodiment, a trench IGBT comprises: a drift region of a first conductivity type; a plurality of trenches laterally confining both first type mesas having a respective source region and a respective body region and second type mesas, the plurality of trenches extending into an inactive cell section and into an active cell section of the IGBT. Both the inactive cell section and the active cell section are arranged in an active region of the IGBT and are separated from each other by at least one spacer region. The trenches of the active cell section do not extend as far towards the drift region as compared to the trenches of the inactive cell section. The trenches of the active cell section are also referred to as control trenches. The trenches of the inactive cell section are also referred to as exposed trenches.

The shield region may be formed to shield the control trenches more than the exposed trenches. Due to the design of the shield region the trench bottoms of the exposed trenches may be geometrically exposed to the drift zone to a greater extent than the trench bottoms of the control trenches. Therefore, the overlap of the shield region with the trench bottoms of the control trenches may be greater compared to the overlap of the shield region with the trench bottoms of the exposed trenches. Additionally or alternatively, the shield region may overlap with the first type mesa to a greater extent than with the second type mesa. The shield region may not overlap the second type mesa at all. This geometrically greater exposure of the exposed trenches may lead to higher electric fields at the trench bottoms of the exposed trenches compared to the control trenches during an operation of the semiconductor device. As a result of the higher electric fields, dynamic avalanche, e.g. during switching condition, may occur primarily in a vicinity of the exposed trenches. By that, occurrence of dynamic avalanche may become less likely in a vicinity of the control trenches. The geometrically greater exposure of the exposed trenches may be provided by differently according to different embodiments:

The shield region may initially be formed asymmetrically to extend more towards the control trenches, the exposed trenches may extend deeper into the semiconductor body than the control trenches, or the shield region may be diminished by means of a counter doping in a vicinity of the trench bottoms of the exposed trenches. The counter doping may be provided by dopants of the first conductivity type. By the counter doping, the shield region may be diminished.

Alternatively, the shield region may be fully omitted in a spacer region adjacent to the second type mesa or directly adjacent to at least one of the trenches confining the second type mesa. In other words, the spacer region adjacent to the second type mesa may comprise no shield region at all. Again in other words, the spacer region directly adjacent to at least one of the trenches confining the second type mesa or more particular at least one of the exposed trenches, may comprise no shield region at all.

Furthermore, a greater exposure of the exposed trenches to the drift region may (as compared to the control trenches) may be achieved by designing the exposed trenches with a greater vertical depth as compared to the control trenches. E.g., the exposed trenches may extend further along the vertical direction as compared to the shield region (if present). For example, if the shield region is present, the exposed trenches may exhibit a bottom portion that is entirely arranged below the shield region so as to directly adjoin into the drift region.

The control trenches may be configured for controlling a formation of an inversion channel in the respective adjacent first type mesa. In contrary, the exposed trenches may not be configured for controlling a formation of an inversion channel in the respective adjacent second type mesa. The formation of an inversion channel in the second type mesa may be suppressed by the design of the second mesa and/or the potential of the exposed trenches or the electrode within respectively. By that, harmful effects of the occurrence of dynamic avalanche in the vicinity of the exposed trenches to the switching behavior of the semiconductor device may be diminished. On the other hand, an improved relaxation of the electrical field and/or improved charge charrier discharge may be provided. Optionally, the second type mesa may form a diode, enabling charge carriers to flow off if the second type mesa is electrically connected with the first load terminal.

According to an embodiment, a method of producing a power semiconductor device comprises forming the following components: a first load terminal at a first side, a second load terminal and, coupled to the first load terminal and the second load terminal, a semiconductor body configured for conducting a load current between the first load terminal and the second load terminal and having a drift region of a first conductivity type; a plurality of trenches at the first side and extending into the semiconductor body along a vertical direction. Each trench includes a trench electrode insulated from the semiconductor body by a trench insulator. Two of the plurality of trenches are arranged laterally adjacent to each other and spatially confine a first type mesa, wherein the first type mesa is configured for conducting a part of the load current between the first load terminal and the drift region. Other two of the plurality of trenches are arranged laterally adjacent to each other and spatially confine a second type mesa configured for not conducting an inversion channel current, the second type mesa being arranged spatially separated from the first type mesa by a spacer region. Producing the power semiconductor device further comprises forming: a source region of the first conductivity type in at least the first type mesa; a body region of a second conductivity type in at least the first type mesa, the body region separating the source region from the drift region; separate from the body region, a shield region of the second conductivity type extending: at least partially further along the vertical direction than bottoms of some of the trenches, wherein bottoms of at least the control trenches extend at least partially into the shield region; so as to form at least a partial lateral overlap with the first type mesa, said partial overlap with the first type mesa being greater as compared to an overlap with the second type mesa. E.g., the shield region is configured in a way to have less or no overlap with the second type mesa when compared to the first type mesa. The second type mesa may be configured for not forming an inversion channel.

According to another embodiment, a method of producing a power semiconductor device comprises forming the following components: a first load terminal at a first side, a second load terminal and, coupled to the first load terminal and the second load terminal, a semiconductor body configured for conducting a load current between the first load terminal and the second load terminal and having a drift region of a first conductivity type; a plurality of trenches at the first side and extending into the semiconductor body along a vertical direction. Each trench includes a trench electrode insulated from the semiconductor body by a trench insulator. Two of the plurality of trenches are arranged laterally adjacent to each other and spatially confine a first type mesa, wherein the first type mesa is configured for conducting a part of the load current between the first load terminal and the drift region. Other two of the plurality of trenches are arranged laterally adjacent to each other and spatially confine a second type mesa configured for not conducting an inversion channel current, the second type mesa being arranged spatially separated from the first type mesa and electrically connected with the first load terminal. A dummy mesa is laterally confined by yet other two of the plurality of trenches and arranged between two of the second type mesas. The dummy mesa is electrically insulated from the first load terminal and has a lateral width of at least 110%, or even of at least 150% of the lateral width of the first type mesa. The lateral width of the dummy mesa may optionally not exceed 400% of the lateral width of the first type mesa. In another example, the lateral width of the dummy mesa may not exceed 200% of the lateral width of the first type mesa. The power semiconductor device further has a source region of the first conductivity type in at least the first type mesa, and a body region of a second conductivity type in at least the first type mesa, the body region separating the source region from the drift region. The second load terminal may be arranged at a second side of the semiconductor body, wherein the second side may be opposite to the first side. The second type mesa may be configured for not forming an inversion channel.

According to another embodiment, a method of producing a trench IGBT comprises forming a drift region of a first conductivity type and a plurality of trenches laterally confining both first type mesas having a respective source region and a respective body region and second type mesas, wherein the plurality of trenches extends into an inactive cell section and into an active cell section of the IGBT. Both the inactive cell section and the active cell section are arranged in an active region of the IGBT and are separated from each other by at least one spacer region. A portion of bottoms of the trenches of the active cell section are separated from the drift region by a shield region of a second conductivity type. A portion of bottoms of the trenches of the inactive cell section are in direct contact with the drift region.

According to another embodiment, a method of producing a trench IGBT comprises forming a drift region of a first conductivity type and a plurality of trenches laterally confining both first type mesas having a respective source region and a respective body region and second type mesas, wherein the plurality of trenches extends into an inactive cell section and into an active cell section of the IGBT. Both the inactive cell section and the active cell section are arranged in an active region of the IGBT and are separated from each other by at least one spacer region. The trenches of the active cell section do not extend as far towards the drift region as compared to the trenches of the inactive cell section.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figures 1, 2:
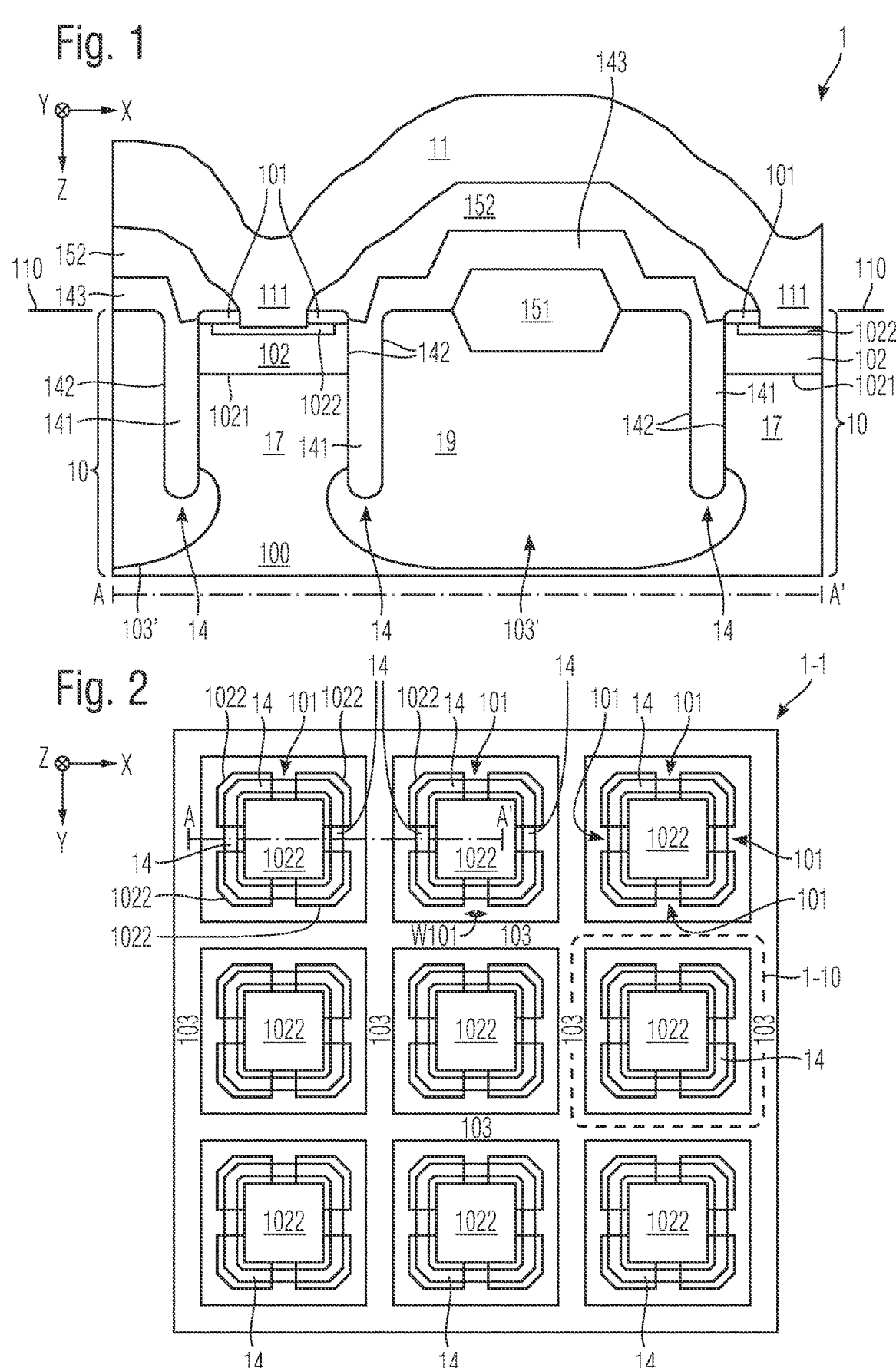
FIG. 1 schematically and exemplarily illustrates a section of a vertical cross-section of a power semiconductor device.
FIG. 2 schematically and exemplarily illustrates a section of a horizontal projection of a power semiconductor device.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device, wherein "low ohmic" may mean that the characteristics of the respective contact are essentially not influenced by the ohmic resistance. Further, in the context of the present specification, the term "in contact" intends to describe that there is a direct physical connection between two elements of the respective semiconductor device; e.g., a transition between two elements being in contact with each other may not include a further intermediate element or the like. Therefore, also the formulation "direct contact" is used herein in order to make clear the direct physical connection between two elements.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells (herein also referred to as unit-cells), such as a monolithically integrated diode cell, a derivative of a monolithically integrated diode cell (e.g., a monolithically integrated cell of two anti-serially connected diodes), a monolithically integrated transistor cell, e.g., a monolithically integrated MOSFET or IGBT cell and/or derivatives thereof. Such diode/transistor cells may be integrated in a power semiconductor module. A plurality of such unit cells may constitute a cell field that is arranged with an active region of the power semiconductor device.

Both terms "power semiconductor device" and "trench IGBT" as used in this specification intend to describe a semiconductor device on a single chip with high voltage blocking and/or high current-carrying capabilities. In other words, such power semiconductor device/trench IGBT is intended for high current, typically in the Ampere range, e.g., up to several Ampere to several hundred Ampere, and/or high voltages, typically above 15 V, more typically 100 V and above, e.g., up to at least 400 V or even more, e.g., up to at least 3 kV, or even up to 15 kV or more, depending on the respective application.

For example, neither the term "power semiconductor device" nor the term "trench IGBT" as used in this specification is directed to logic semiconductor devices that are used for, e.g., storing data, computing data and/or other types of semiconductor based data processing.

The present specification in particular relates to power semiconductor devices embodied as respective trench MOS-FETs or trench IGBTs, i.e., unipolar or bipolar power semiconductor transistors that are controlled by insulated trench electrodes (gates), or as a derivate of a trench MOSFET or trench IGBT.

For example, the power semiconductor device (e.g., embodied as a trench IGBT) described below may be a single semiconductor chip exhibiting a stripe cell configuration or a columnar/needle cell configuration and can be configured to be employed as a power component in a low-, medium- and/or high voltage application.

FIG. 1 schematically and exemplarily illustrates a section of a vertical cross-section of a power semiconductor device 1. FIG. 2 schematically and exemplarily illustrates a section of a horizontal projection of the power semiconductor device 1, with line AA' indicating the region corresponding to the vertical cross-section in FIG. 1.

In the following, it will be referred to both FIG. 1 and FIG. 2.

The power semiconductor device 1 can be based on/implemented within a single-chip. E.g., the power semiconductor device 1 is configured as an IGBT or as a MOSFET or a derivate of an IGBT (such as a reverse conducting, RC, IGBT) or as a derivate of a MOSFET.

The power semiconductor device 1 has a first load terminal 11 at a first side 110, a second load terminal 12 (not illustrated in FIG. 1, cf. e.g., FIG. 9) and, coupled to the first load terminal 11 and the second load terminal 12, a semiconductor body 10 configured for conducting a load current between the first load terminal 11 and the second load terminal 12 and having a drift region 100 of a first conductivity type.

Figure 9:
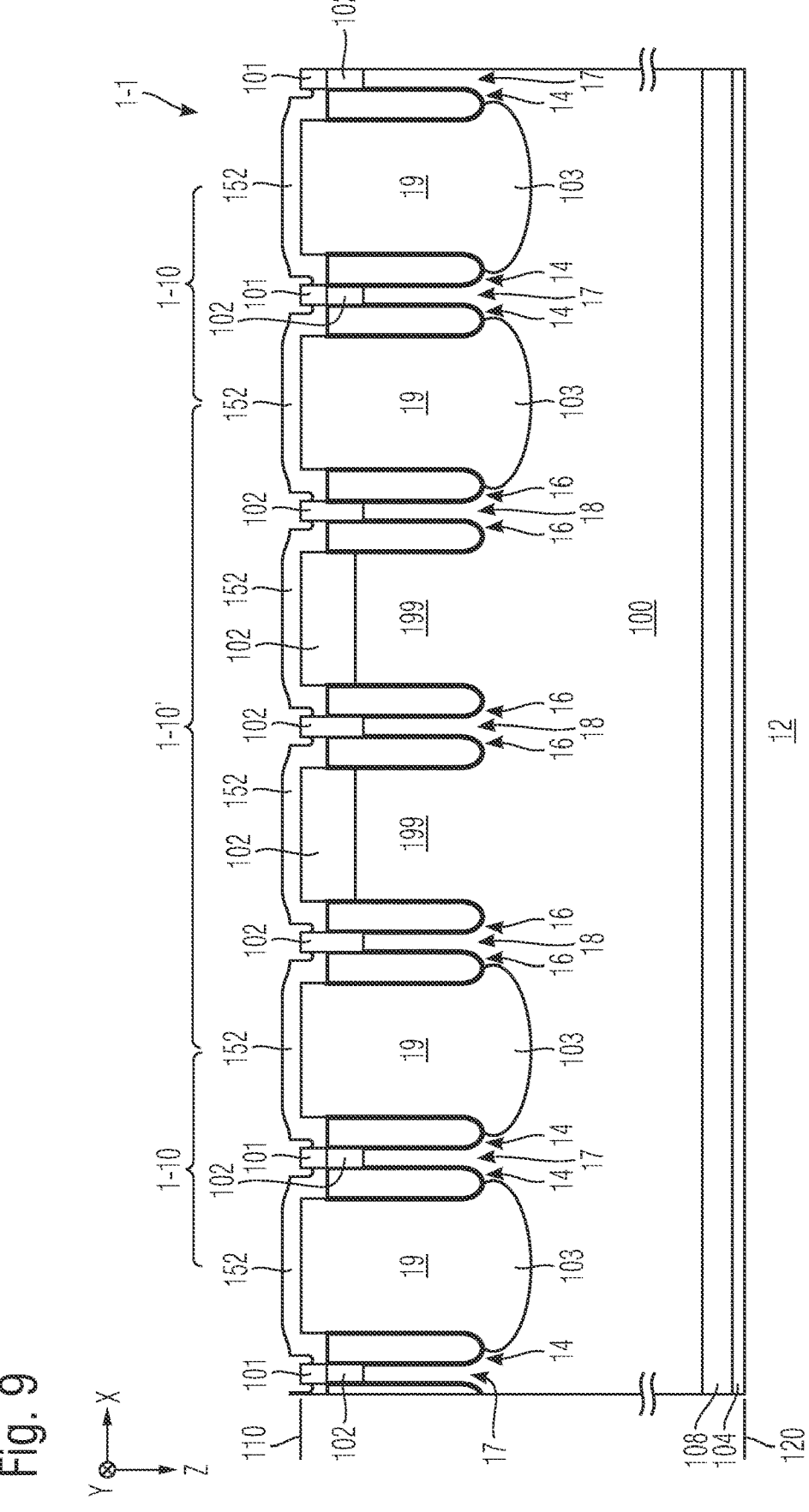
FIGS. 9-10 both schematically and exemplarily illustrate a respective section of a vertical cross-section of a power semiconductor device in accordance with one or more embodiments.

As better illustrated in FIG. 9, the semiconductor body 10 may be arranged between the first load terminal 11 and the second load terminal 12, wherein the second load terminal 12 may be arranged at a second side 120 of the power semiconductor device 1. The power semiconductor device 1 may have a vertical design, according to which the load current in the drift region 100 follows a path essentially in parallel to the vertical direction Z.

The first load terminal 11 is partially separated from the semiconductor body 10, e.g., based on an insulation layer 152, and partially in contact with portions of the semiconductor body 10, e.g., based on contact plugs 111.

A plurality of trenches 14 is arranged at the first side 110. Each trench 14 extends into the semiconductor body 10 along the vertical direction Z. Each trench 14 includes a trench electrode 141 insulated from the semiconductor body 10 by a trench insulator 142.

The trench electrodes 141 of the trenches 14 may be formed by an electrically conductive material 143 that is separated from the semiconductor body 10, e.g., based on an oxide layer that also forms the trench insulators 142.

The plurality of trenches 14 may comprise one or more control trenches 14 whose trench electrodes 141 are electrically connected to a control terminal (not illustrated) of the power semiconductor device 1, typically referred to as gate terminal.

Two of the plurality of trenches are arranged laterally adjacent to each other and spatially confine a first type mesa 17, wherein the first type mesa 17 is configured for conducting a part of the load current between the first load terminal 11 and the drift region 100.

A source region 101 of the first conductivity type is provided in at least the first type mesa 17. Furthermore, a body region 102 of the second conductivity type is provided in at least the first type mesa 17, wherein the body region 102 separates the source region 101 from the drift region 100. In portion where the contact plug 111 contacts the body region 102, the body region 102 may exhibit a dopant concentration greater as compared to the dopant concentration in its remaining portion. Said portion of the body region 102 that has the increased dopant concentration is herein referred to as body contact region 1022.

E.g., for load current conduction, an inversion channel is induced in the body region 102 of the first mesa 17, e.g., by subjecting the trench electrode 141 with a corresponding control signal.

In the first type mesa 17, both the source region 101 and the body region 102 are electrically connected to the first load terminal 11, e.g., via the contact plug 111, and a pn-junction 1021 is formed by a transition between the body region 102 and a region of the first conductivity type (e.g., formed by the drift region 100).

For example, the first type mesa 17 is spatially confined by at least one of the control trenches 14.

Another first type mesa 17 may be arranged spatially separated from the first type mesa 17 by a spacer region 19. Said spacer region 19 may have a width along the first lateral direction X greater than the width of the first type mesa 17, as illustrated in FIG. 1. The spacer region 19 between the first type mesas 17 may be separated from the first load terminal 11, e.g., based on an oxide layer that also forms the trench sidewalls of the trenches 14 laterally confining the spacer region 19 and/or based on an insulation block 151. In an embodiment, only one spacer region 19 is arranged between the first type mesa 17 and the second type mesa 18.

The term "spacer region" as used in this invention describes, according to at least some embodiments, a region between two trenches 14, 16 and/or two mesas 17, 18. The spacer region 19 may neither comprise any mesa nor comprise any trenches. Therefore, trenches 14, 16 and/or mesa 17, 18 may be separated by said spacer region 19 in between. The spacer region 19 may be separated or insulated from the first load terminal 11 by one or more insulating or high-ohmic layers. e.g., based on the oxide layer that also forms the trench insulators 142, 162. Hence, no direct conduction of current between the spacer region 19 and the first load terminal 11 may be possible.

The power semiconductor device 1 further comprises, separate from the body region 102 (and, e.g., at the first side 110), a shield region 103' of the second conductivity type extending: at least partially further along the vertical direction than bottoms of some of the trenches 14, wherein bottoms of at least the control trenches 14 extend at least partially into the shield region 103' and so as to form at least a partial lateral overlap with the first type mesa 17.

In FIG. 2, the lateral layout of one unit cell having nine active cell sections 1-10 of the power semiconductor device 1 of FIG. 1 is illustrated. The power semiconductor device 1 may have a plurality of such unit cells 1-1 in its active region, constituting a unit cell system, for example.

It has been recognized, that certain configurations of the shield region 103' can be disadvantageous with respect to dynamic avalanche behavior of the power semiconductor device 1.

Accordingly, another configuration of the shield region is proposed, as will be explained with respect to FIGS. 3-21; there, the shield region will be referred to with reference sign 103, whereas the remaining reference signs remain unchanged and designate parts corresponding to those illustrated in FIGS. 1-2.

Figure 3:
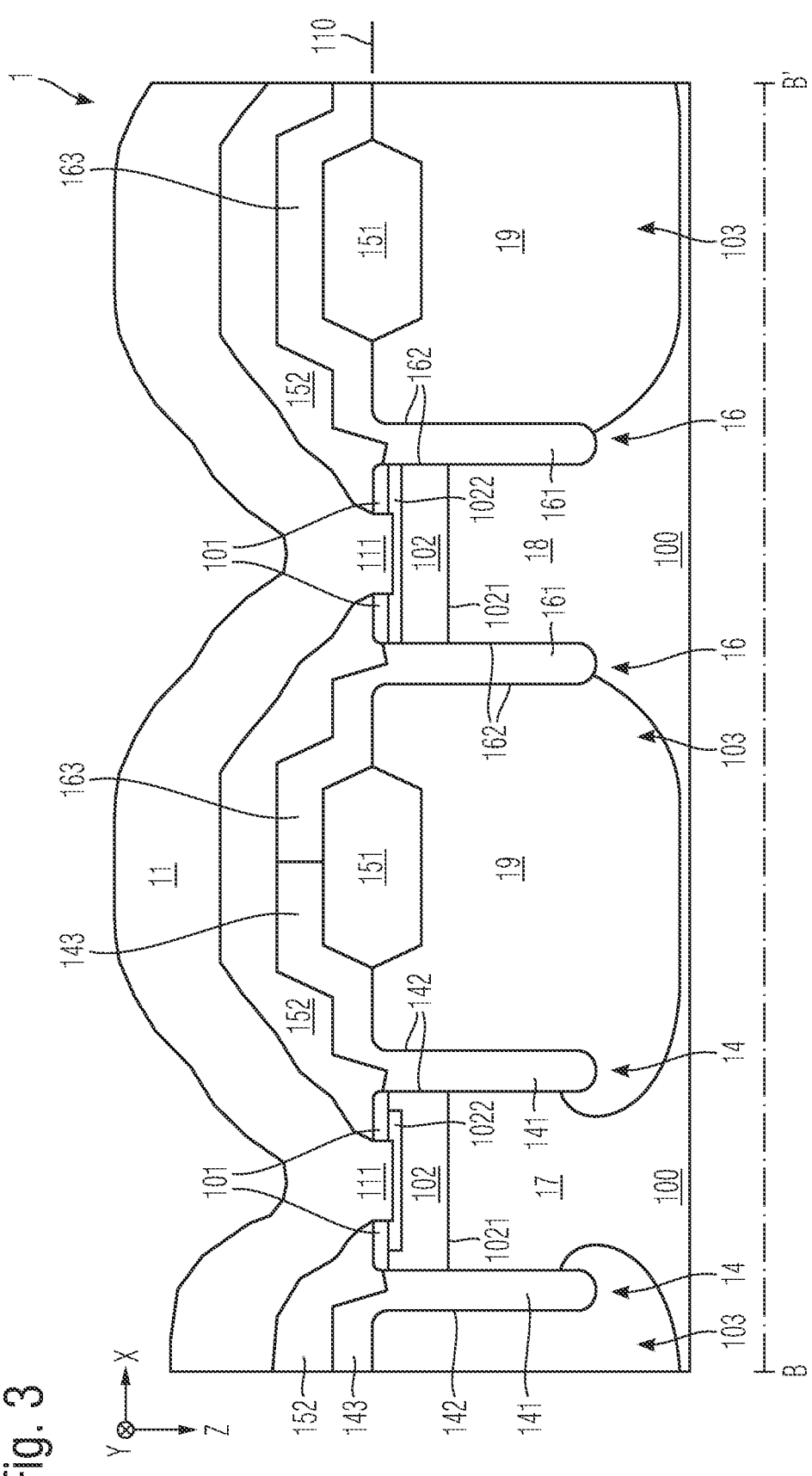
FIG. 3 schematically and exemplarily illustrates a section of a vertical cross-section of a power semiconductor device in accordance with one or more embodiments.

FIG. 3 schematically and exemplarily illustrates a section of a vertical cross-section of a power semiconductor device 1 in accordance with one or more embodiments.

The description related to FIG. 1 may equally apply for the embodiment of FIG. 3, except for the configuration of the shield region 103.

Further, other two of the plurality of trenches 16 are arranged laterally adjacent to each other and spatially confine a second type mesa 18 configured for not conducting an inversion channel current. In the illustrated example of FIG. 3, the second type mesa 18 is connected to the first load terminal 11 based on its body region 102, or more particular its highly doped body contact region 1022. In the illustrated example of FIG. 3, the induction of the inversion channel is prevented by the body contact region 1022 which fully separates the entire source region 101 from the remaining (less strongly doped) portion of the body region 102. The second type mesa 18 is arranged spatially separated from the first type mesa 17 by the spacer region 19. The trench electrodes 161 of the trenches 16 may be formed by an electrically conductive material 163 that is separated from the semiconductor body 10, e.g., based on an oxide layer that also forms the trench insulators 162. The second type mesa 18 may be configured for not forming an inversion channel.

The lateral width WM of the spacer region 19 may be at least 30% of the lateral width of the first type mesa 17. E.g., the lateral width WM of the spacer region 19 is within the range of 30% to 300% of the lateral width of the first type mesa 17, or even at least 50% thereof. The lateral width of the spacer region 19 may optionally not exceed 400% of the lateral width of the first type mesa 17. In another example, the lateral width of the spacer region 19 may not exceed 200% or may not exceed 150% of the lateral width of the first type mesa 17. As illustrated, the spacer region 19 may have a mesa-like design.

In accordance with the embodiment of FIG. 3, the shield region 103 is configured so as to extend as follows: at least partially further along the vertical direction Z than bottoms of some of the trenches 14, wherein bottoms of at least the control trenches 14 extend at least partially into the shield region 103; so as to form at least a partial lateral overlap with the first type mesa 17, said partial overlap with the first type mesa 17 being greater as compared to an overlap with the second type mesa 18. E.g., the shield region 103 is configured in a way to have less or no overlap with the second type mesa 18 when compared to the first type mesa 17.

In an embodiment, the shield region 103 does not laterally overlap with the second type mesa 18. E.g., a vertical projection of a horizontal cross-section of the second type mesa 18 does traverse the shield region 103, in accordance with an embodiment. Such "pulled-back" configuration of the shield region 103 may enhance the occurrence of dynamic avalanche at the bottoms of exposed trenches 16 during a switching operation, e.g., during turn-off operation.

Generally, in accordance with embodiments described herein, the total lateral overlap between the shield region 103 and the first type mesa 17 may be greater as compared to the total lateral overlap between the shield region 103 and the second type mesa 18 (which may even be non-existing). In other words, one or both of the trenches 16 laterally confining the second type mesa 18 may be fully or partially exposed (to the drift region 100) in their respective bottoms regions, whereas the one or both of the trenches 14 laterally confining the first type mesa 17 may be fully or partially covered by the shield region 103. In the region of the "exposed trenches" that laterally confine the second type mesa 18 (where no inversion channel is induced), likelihood of local dynamic avalanches is higher. Hence, by specifically configuring the total amount of "exposed trench portions", dynamic avalanche behavior may be advantageously controlled.

The plurality of trenches may comprise control trenches 14 whose trench electrodes 141 are electrically connected to the control terminal of the power semiconductor device 1, and exposed trenches 16. The trench electrodes 161 of the exposed trenches 16 may also be electrically connected to the control terminal, or to another terminal, such as the first load terminal 11 (so-called source trenches). The first type mesa 17 is spatially confined by at least one of the control trenches 14, and the second type mesa 18 is spatially confined by at least one of the exposed trenches 16. Irrespective of the electrical potential of the trench electrode 161 of the exposed trench 16, the trench electrode 161 does not qualify as "control electrode", as the second type mesa 18 is not configured for forming an inversion channel. The bottom of said at least one control trench 14 laterally confining the first type mesa 17 extends entirely into the shield region 103, whereas the bottom of said at least one exposed trench 16 laterally confining the second type mesa 18 does not or only partially extend into the shield region 103. The second type mesa 18 may be configured for not forming an inversion channel.

With respect to FIGS. 11-21, an exemplary method of producing a power semiconductor device 1 with such a "pulled-back" configuration of the shield region 103 will be explained further below. In addition or alternatively to this method, the non-overlap or, respectively, the smaller overlap between the second type mesa 18 and the shield region 103 may be achieved by designing at least one of the other trenches 16 that confine the second type mesa 18 with an increased extension along the vertical direction Z. Hence, the trench 16 between the spacer region 19 and the second type mesa 18 may extend further along the vertical direction Z as compared to the trench 14 between the spacer region 19 and the first type mesa 17, thereby preventing the shield region 103 from laterally overlapping with the second type mesa 18. A yet further approach for implementing the smaller/non-overlap between the shield region 103 and the second type mesa 18 may be achieved by a local first conductivity type counter-doping of the shield region 103. E.g., in proximity of the bottom of the trench 16 between the spacer region 19 and the second type mesa 18, a counter-doping based on an n-type implant may be provided. In an embodiment, the semiconductor body 10 hence comprises a counter doping of the first conductivity type directly adjacent to the trench bottoms of the exposed trenches 16, wherein by the counter doping an effective doping of the doping of the shield region 103 is reduced to diminish the extension of the shield region 103 at the trench bottoms of the exposed trenches 16.

Here, it should be noted that the second type mesa 18 may also be electrically connected to the first load terminal 11, as illustrated in FIG. 3. For example, one of the contact plugs 111 extends to the second type mesa 18 and contacts a region of the second conductivity type that is included in the second type mesa 18, such as a body region 102. However, the second type mesa 18 may be incapable of forming an inversion channel in the body region 102. For example, such configuration may be ensured by omitting the source region 101 in the second type mesa 18 or, as illustrated in FIG. 3, by designing the body contact region 1022 such it separates the entire source region 101 from the remaining (less strongly doped) portion of the body region 102. In the latter case, the body contact regions 1022 prevents occurrence of an inversion channel in the body region 102 of the second type mesa 18. By contrast, in the first type mesa 17, an inversion channel shall be induced so as to allow the (forward) load current in the first type mesa 17. To this end, portions of the source region 101 in the first type mesa 17 adjoin into both the body contact region 102 and into the remaining (less strongly doped) portion of the body region 102.

Thus, in an embodiment, the second type mesa 18 does not contribute to the dynamics of a turn-on operation, as an inversion channel in the body region 102 of the second type mesa 18 is not induced (e.g., either due to absence of a source region 101 or due to a "blocking" body contact region 1022 (cf. FIG. 3)), but improves/supports occurrence of dynamic avalanche at the bottom of 16 during turn-off operation.

The bottom(s) of at least one of the trenches-16 that laterally confine the second type mesa 18 is/are not or to a lesser degree protected by the shield region 103, as illustrated in FIG. 3. At the same time, the second type mesa 18 may be provided in an active region of the power semiconductor device 1 in accordance with a specific design rule.

The active region of the power semiconductor device 1 is the region that conducts the load current of the power semiconductor device 1. The active region is surrounded by an edge termination region (not illustrated), which is terminated by a chip edge. The design as exemplarily illustrated in FIG. 3 is related to the configuration of the active region of the power semiconductor device 1.

Figure 4:
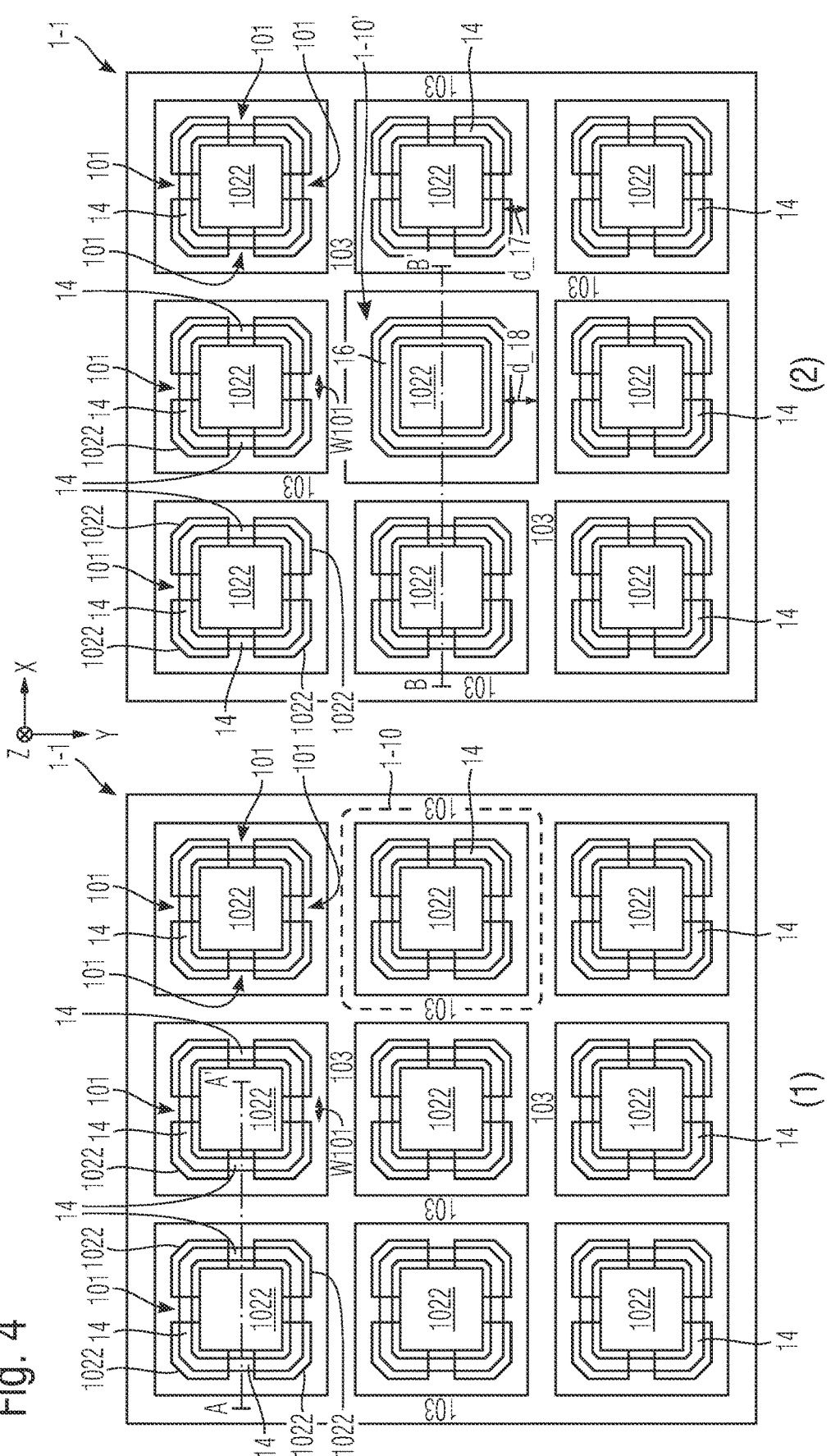
FIG. 4 schematically and exemplarily illustrates two variants of a section of a horizontal projection of a power semiconductor device in accordance with one or more embodiments.

The active region of the power semiconductor device 1 may comprise a plurality of equally configured unit cells 1-1. FIG. 4, variant (1), shows an exemplary lateral layout design of such unit cell 1-1. The explanation related to FIG. 2 equally applies to FIG. 4, variant (1). Accordingly, each unit cell 1-1 may be equally configured and comprise a plurality, e.g., nine, cell sections 1-10. As illustrated, the unit cell 1-1 may be separated into a plurality of regions having the same horizontal area size, and each cell section 1-10 is provided in a respective one of the regions. In accordance with the reference design illustrated in FIG. 4, variant (1), each cell section 1-10 is designed in accordance with the configuration illustrated in FIG. 1. That is, in variant (1), each cell section 1-10 may be an equally configured active cell section 1-10.

Herein, it is proposed to design at least one of the cell sections 1-10 with a configuration as illustrated in FIG. 3, i.e., where the second type mesa 18 does not (or, respectively, to a lesser extent) laterally overlap with the shield region 103. Such design is exemplarily illustrated in FIG. 4, variant (2), where the central cell section 1-10' is designed in accordance with the configuration as illustrated in FIG. 3 (corresponding to a region BB' indicated in FIG. 4, variant (2)), i.e., with the second type mesa 18 being not configured to provide for an inversion channel (which is, in FIG. 4, indicated based on the missing source region 101 and the uninterrupted body contact region 1022 at the central cell section 1-10') and where the shield region 103 is "pulled back" from the central cell section 1-10' such that the shield region 103 does not laterally overlap with the second type mesa 18 of the central cell section 1-10' (which is, in FIG. 4, indicated based on the distance d_18 between the central section 1-10' and the shield region 103 that is greater than the distance d_17 between an adjacent cell section 1-10 and the shield region 103). The eight cell sections 1-10 surrounding the central cell section 1-10' may be designed in accordance with the configuration as illustrated in FIG. 1. The central cell section 1-10' may be regarded as an inactive cell section 1-10'.

E.g., depending on the rated current of the power semiconductor device 1, the active region of the power semiconductor device 1 may have a total of at least 100, or more than a few hundred to hundreds of thousands of unit cells 1-1, each having at least two cell sections 1-10. In at least one of the total amount of unit cells 1-1, at least one inactive cell section 1-10' is provided. Further, in an embodiment, in each of at most 50% of the total amount of unit cells 1-1, at least one inactive cell section 1-10' is provided. That is, at least 50% of the total amount of unit cells 1-1 are not equipped with an inactive cell section 1-10', but only with active cell section 1-10. The exact design rule depends on the designated dimension of the inversion channels, which in turn depends on the application and the rating of the power semiconductor device 1.

For example, in an embodiment, the power semiconductor device 1 hence comprises, in its active region, a plurality of unit cells 1-1, each unit cell 1-1 comprising a plurality of (e.g., nine) cell sections 1-10, wherein, in each of at least one or at most 50% of the unit cells 1-1, a first number of the cell sections 1-10 is configured in accordance with the provision that the shield region 103 does not (or, respectfully, to a lesser extent) laterally overlap with the second type mesa 18. A second number of the of the cell sections 1-10 is configured in accordance with the provision that the shield region 103 laterally overlaps with both the first type mesa 17 and the second type mesa 18. The sum of the first number and the second number is equal to the total of the cell sections 1-10 of the respective unit cell 1-1. The ratio between first number and the second number is equal to or smaller than 1/2, 1/9, 1/100 or even smaller than 1/1000. That is, the majority of the cell sections 1-10 may be designed as illustrated in FIG. 1, and a minority of the cell sections 1-10 may be designed as illustrated in FIG. 3.

The ratio between the first number and the second number may be representative for the share of the second type mesas 18 in the active region of the power semiconductor device 1 that does not overlap with the shield region 103. The remaining share of all mesas in the active region may overlap with the shield region 103.

Furthermore, as in the second type mesas 18, an induction of an inversion channel is not possible, a width of the inversion channel in the first type mesas 17 may be increased by a corresponding increase of the lateral width W101 of the source regions 101 in the cell-sections 1-10 that configured in accordance with the provision that the shield region 103 laterally overlaps with both the first type mesa 17 and the second type mesa 18.

Figure 5:
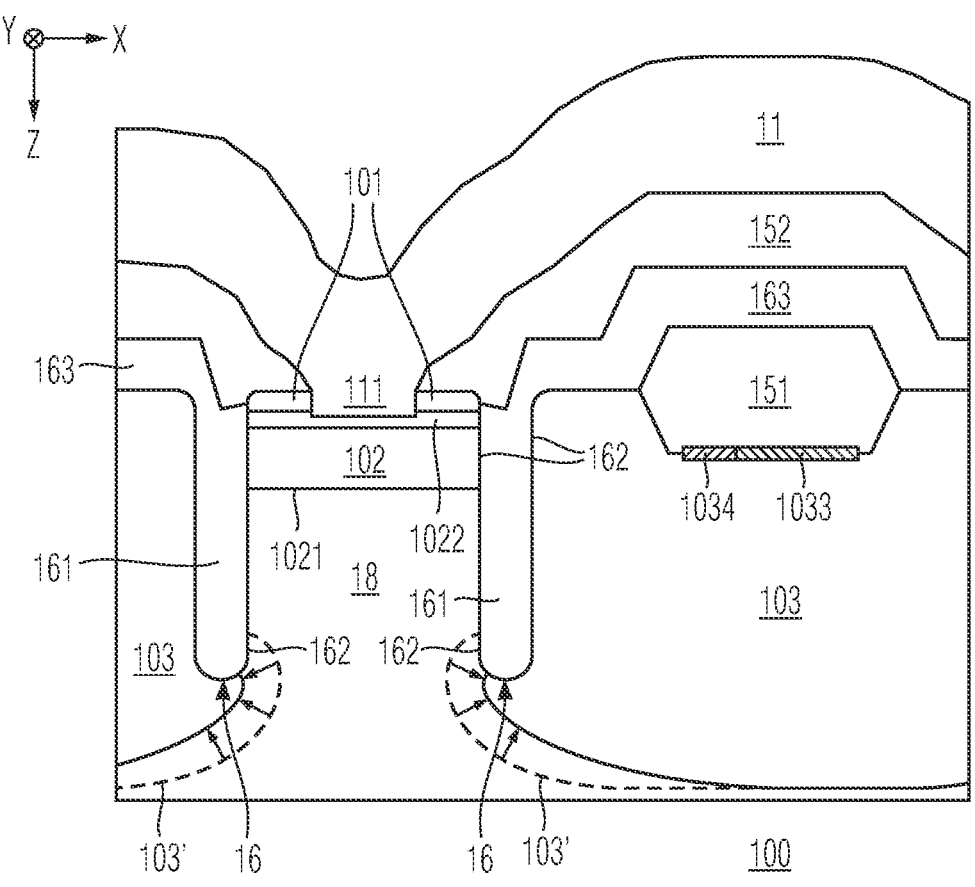
FIG. 5 schematically and exemplarily illustrates a section of a vertical cross-section of a power semiconductor device in accordance with one or more embodiments.

FIG. 5 shows schematically and exemplarily a section of a vertical cross-section of the power semiconductor device 1 in accordance with one or more embodiments. The explanation as provided with respect to FIG. 3 equally applies to FIG. 5. As illustrated, in the second type mesa 18, induction of an inversion channel is prevented based on the body contact region 1022 that extends below the source region 101 and along the entire width of the second type mesa 18. In addition or alternatively, the source region 101 may be omitted in the second type mesa 18. The "pulled-back" shield region 103 (indicated by the arrows; shield region 103' would correspond to an alternative configuration) may be achieved based on asymmetrically providing a seed region 1033 in the spacer region 19 below insulation block 151. E.g., based on a corresponding mask design, said seed region 1033 is not formed in section 1034, such that, during a diffusion process, the shield region 103 does not extend so as to overlap with the second type mesa 18. This aspect will be explained in more detail with respect to FIGS. 11-21. Alternatively (not depicted), the asymmetrical formation of the shield region 103 may be enabled by an additional counter doping of the shield region 103 through the trench bottoms.

The spacer region 19 that separates the first type mesa 17 from the second type mesa 18 may be electrically insulated from the first load terminal 11; e.g., any transition along the vertical direction between the first load terminal 11 and the spacer region 19 may not be electrically conductive. Further, in a vertical cross-section in parallel to the first lateral direction X, the spacer region 19 may be entirely filled with the shield region 103. As illustrated, the shield region 103 may extend laterally from the spacer region 19 so as to laterally overlap with the first type mesa 17 at least partially and so as to not (or, respectively, to a lesser extent) laterally overlap with the second type mesa 18.

For example, the lateral width of the spacer region 19 is within the range of 10% to 400%, or within the range of 30% to 300% of the lateral width of the first type mesa 17, or within the range of 50% to 200% of the lateral width of the first type mesa 17.

Figure 6:
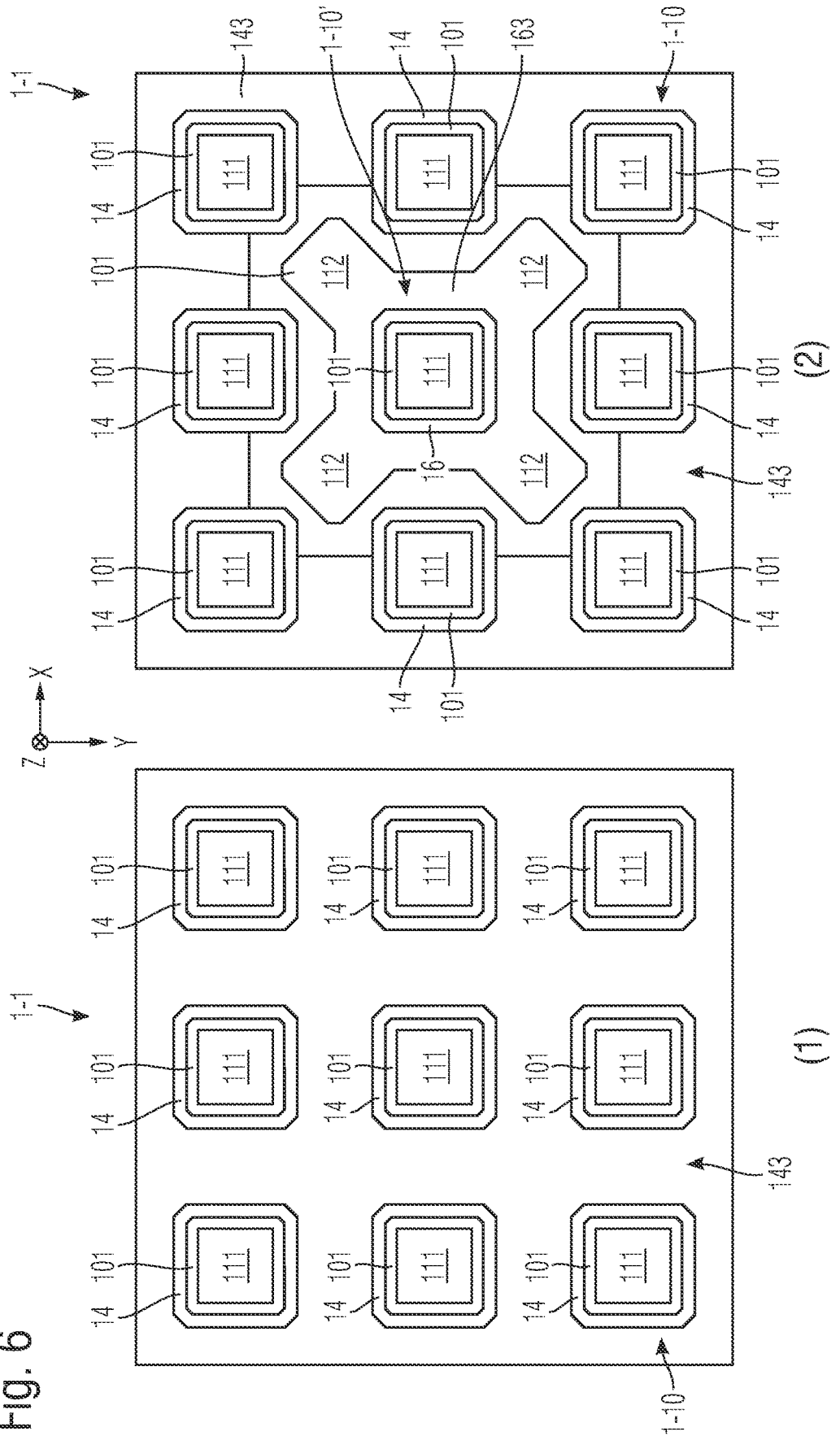
FIG. 6 schematically and exemplarily illustrates two variants of a section of a horizontal projection of a power semiconductor device in accordance with one or more embodiments.
Figure 7:
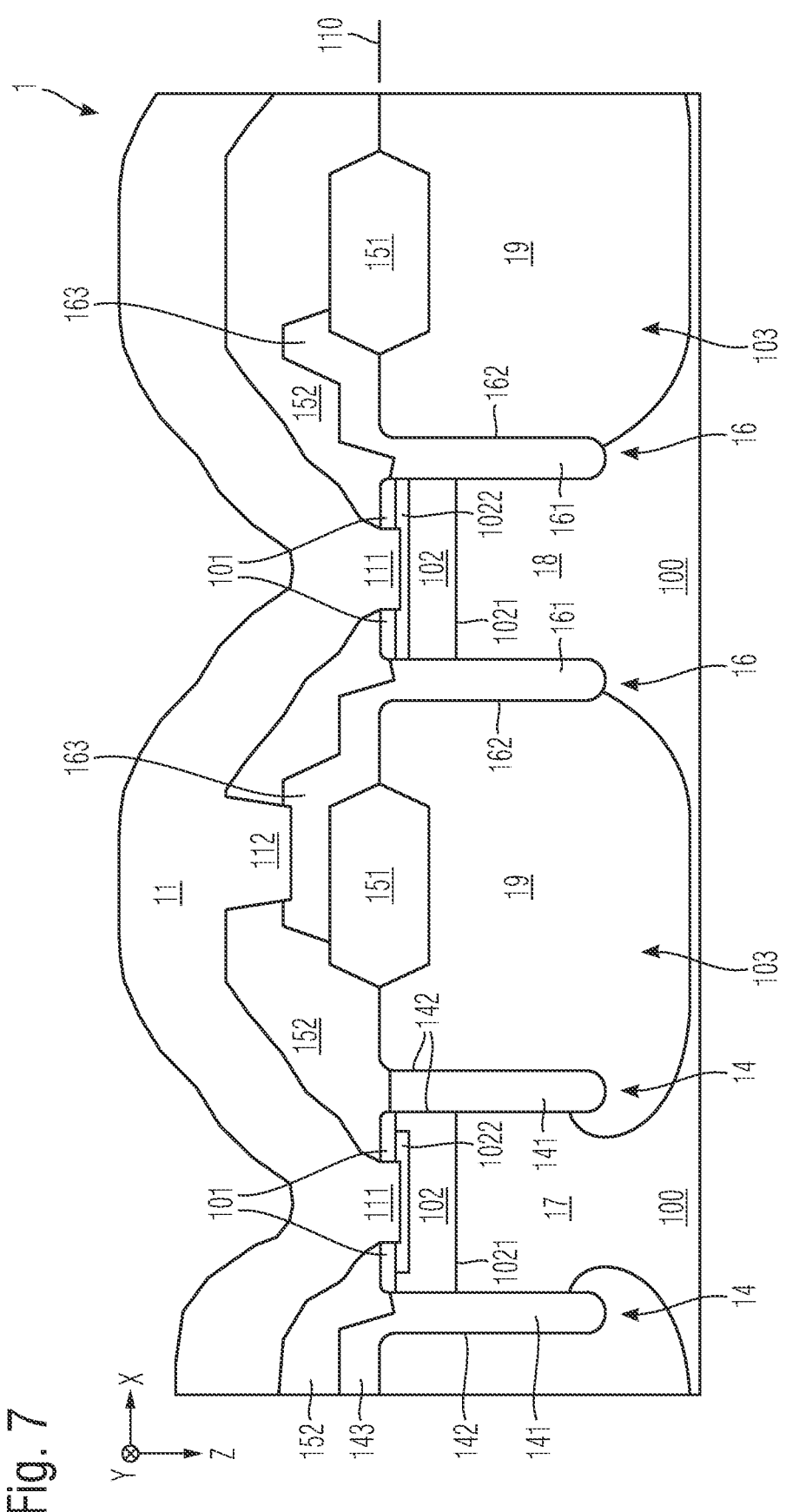
FIG. 7 schematically and exemplarily illustrates a section of a vertical cross-section of a power semiconductor device in accordance with one or more embodiments.

FIG. 6 schematically and exemplarily illustrates two variants of a section of a horizontal projection of the power semiconductor device 1 in accordance with one or more embodiments. Variant (1) shows a reference design and variant (2) shows the design that is herein proposed for one or more embodiments. Accordingly, as in FIG. 4, according to both designs, each of the plurality of unit cells 1-1 that are present in the active region of the power semiconductor device 1 may comprise nine cell sections 1-10. In the reference design according to variant (1), each cell section 1-10 may be equally configured. The modification of the reference design is reflected in the central cell section 1-10' of the design according to FIG. 6, variant (2), and FIG. 7, to which it will now be referred. The explanation of FIG. 3 equally applies to FIG. 7. In accordance with the embodiment illustrated in FIG. 6, further contact plugs 112 are provided that establish the electrical connection between the electrically conductive material 163 and the first load terminal 11. For example, the second type mesa 18 is hence laterally confined by two source trenches 16 whose trench electrodes are electrically connected with the first load terminal 11. At the same time, the second type mesa 18 is in this example also electrically connected with the first load terminal 11 based on the contact plug 111.

As explained above, the trench electrodes 161 of the trenches 16 that laterally confine the second type mesa 18 are for example not electrically floating, but connected to either the first load terminal 11 or to said control terminal (not illustrated) that provides the electrical potential for the trench electrodes of the control trenches 14.

Figure 8:
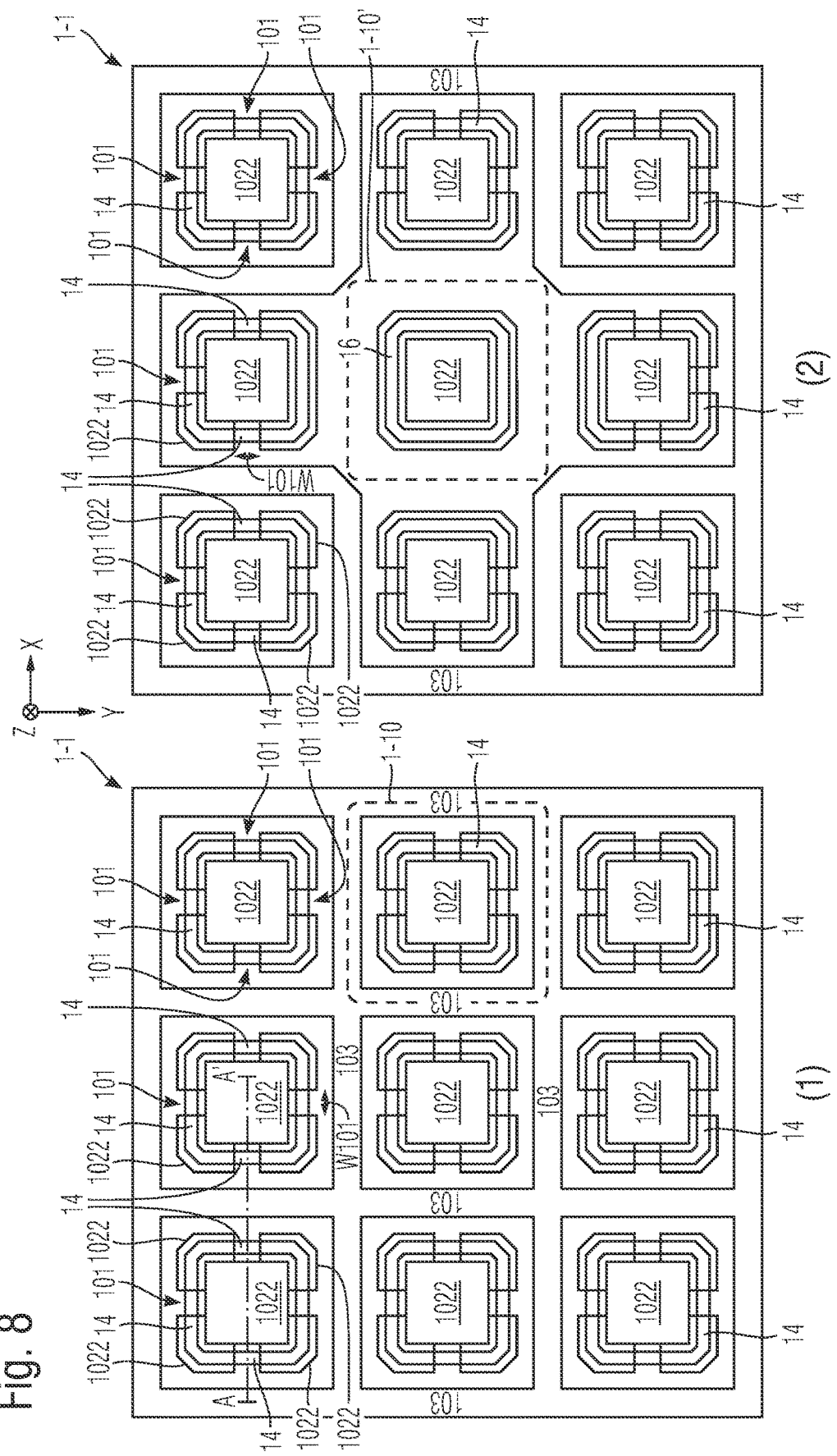
FIG. 8 schematically and exemplarily illustrates two variants of a section of a horizontal projection of a power semiconductor device in accordance with one or more embodiments.

The explanation directed to FIG. 4 equally applies to FIG. 8. In addition to the embodiment illustrated in FIG. 4, variant (2), according to an embodiment illustrated in FIG. 8, variant (2), the shield region 103 surrounding the central one of the nine cell sections 1-10 of the unit cell is quasi entirely removed, not only "pulled back". Due to the unprotected trench bottoms in the central cell section 1-10', the central cell section 1-10' does not include a first type mesa 17. As illustrated, portions of the four cell-sections 1-10 directly adjacent to the central cell section 1-10' (namely at the four cell sections 1-10 above, at the right, below and at the left of the central cell section 1-10') are partially de-activated which is illustrated by the missing source region 101 in said portions flanking the central cell section 1-10'. As explained above, de-activation may occur, e.g., by not providing the source region 101 or by extending the body contact region 1022 such that it entirely covers the source region 101 and no induction of the inversion channel is possible.

Generally, the lateral width of the second type mesa 18 can be within the range of 10% to 200% of the lateral width of first type mesa 17, alternatively within 50% to 200% of the width of the first type mesa 17. The second type mesa 18 may even have the same size as the first type mesa 17. As used herein, in this context the formulation "same size" means that the lateral width of the second type mesa 18 is within the range of 90% to 110% of the first type mesa 17, the lateral width of the second type mesa 18 is within the range of 95% to 105% of the first type mesa 17. However, it should be noted that the trenches laterally confining the first type mesa 17 and the second type mesa 18 may have different total extensions along the vertical direction Z (e.g., so as to avoid the lateral overlap between the second type mesa 18 and the shield region 103).

In an embodiment, the shield region 103 may be electrically floating. For example, the shield region 103 is not electrically connected to a fixed electrical potential, e.g., to none of the first load terminal 11, the second load terminal 12 or another terminal of the power semiconductor device 1. Or, the shield region 103 is electrically connected to the first load terminal 11.

Figure 10:
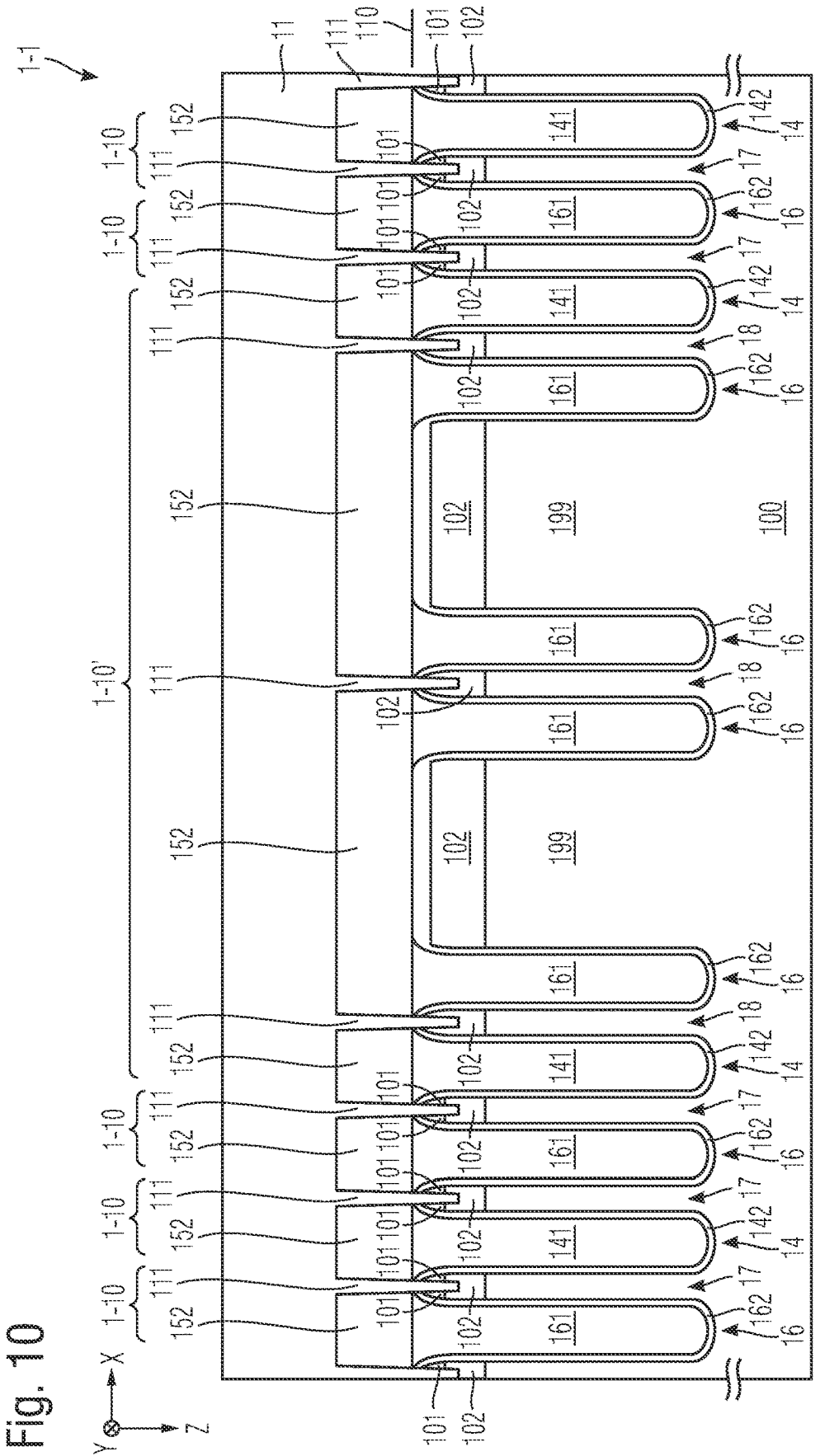
Figure 11:
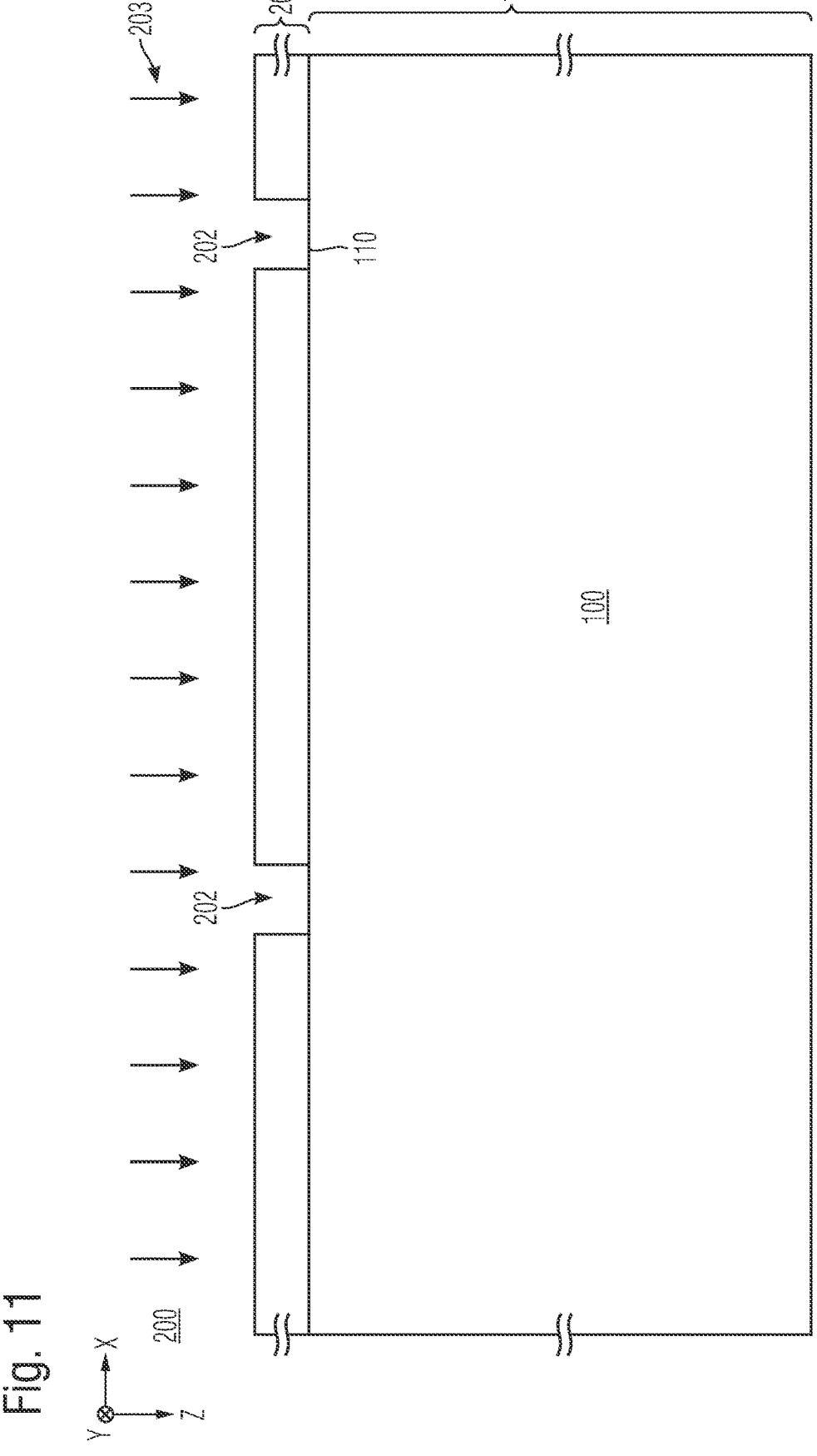
FIGS. 11-21 schematically and exemplarily illustrates, based on sections of a vertical cross-section, a method of producing a power semiconductor device in accordance with one or more embodiments.
Figure 12:
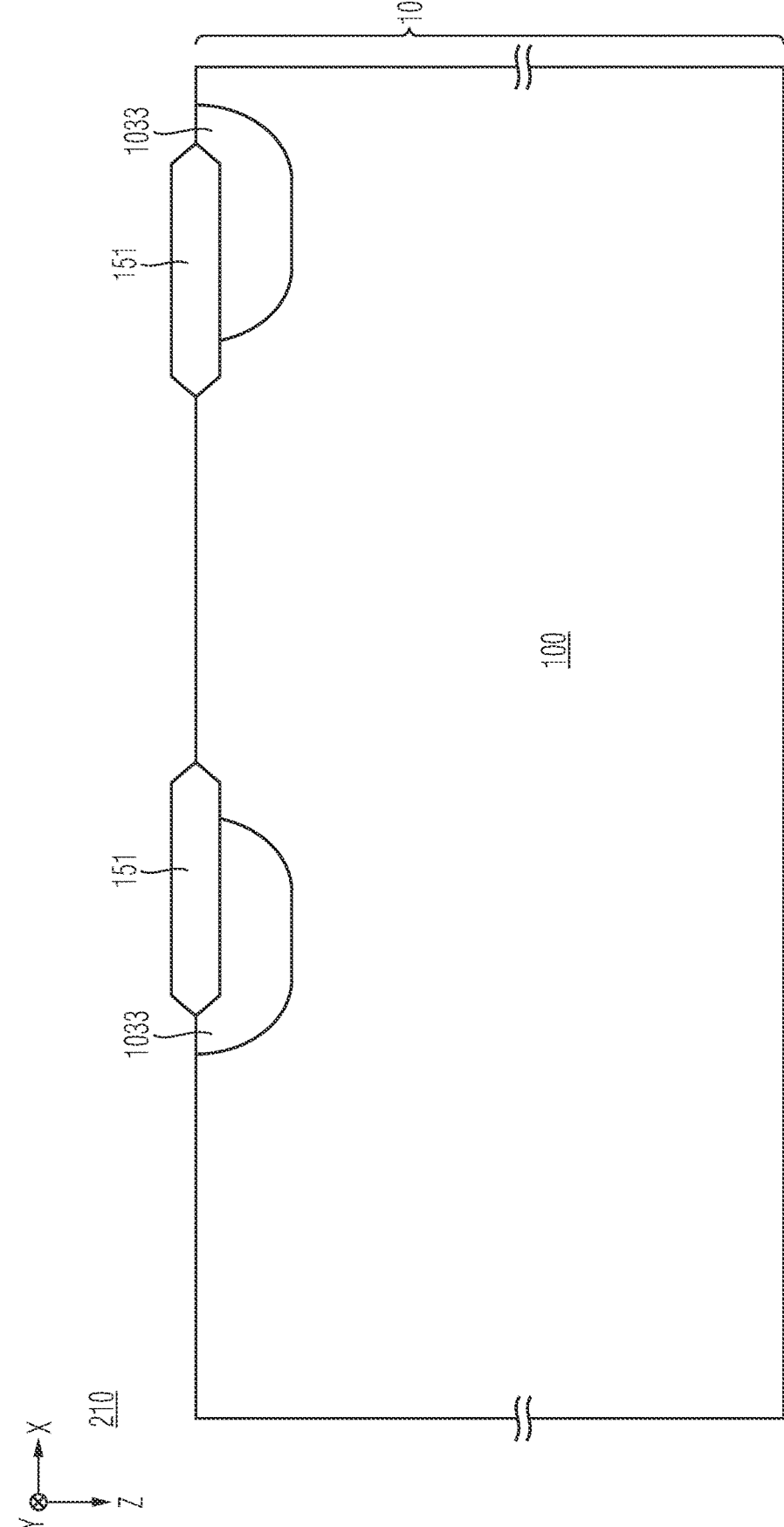
Figure 13:
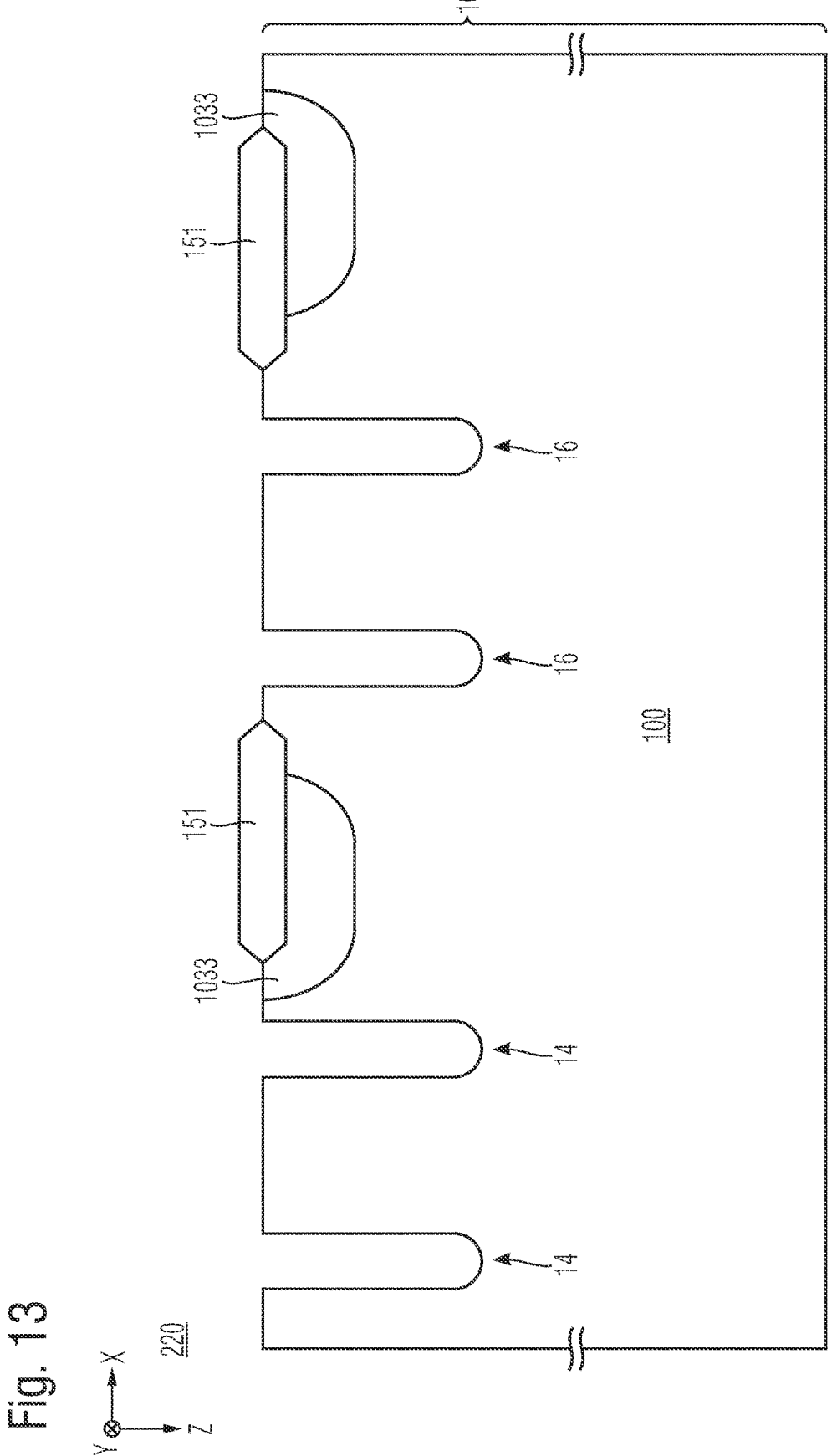
Figure 14:
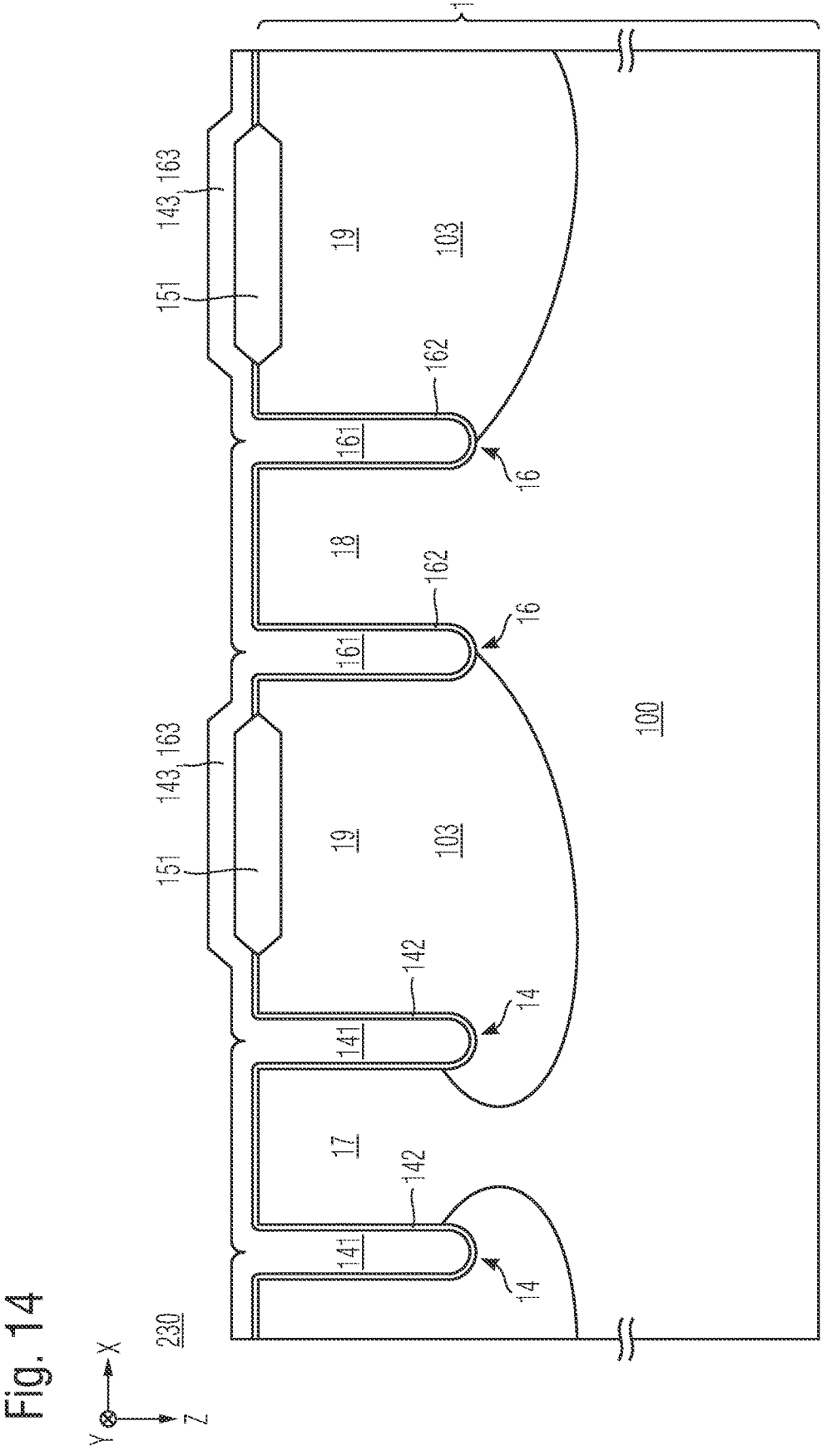
Figure 15:
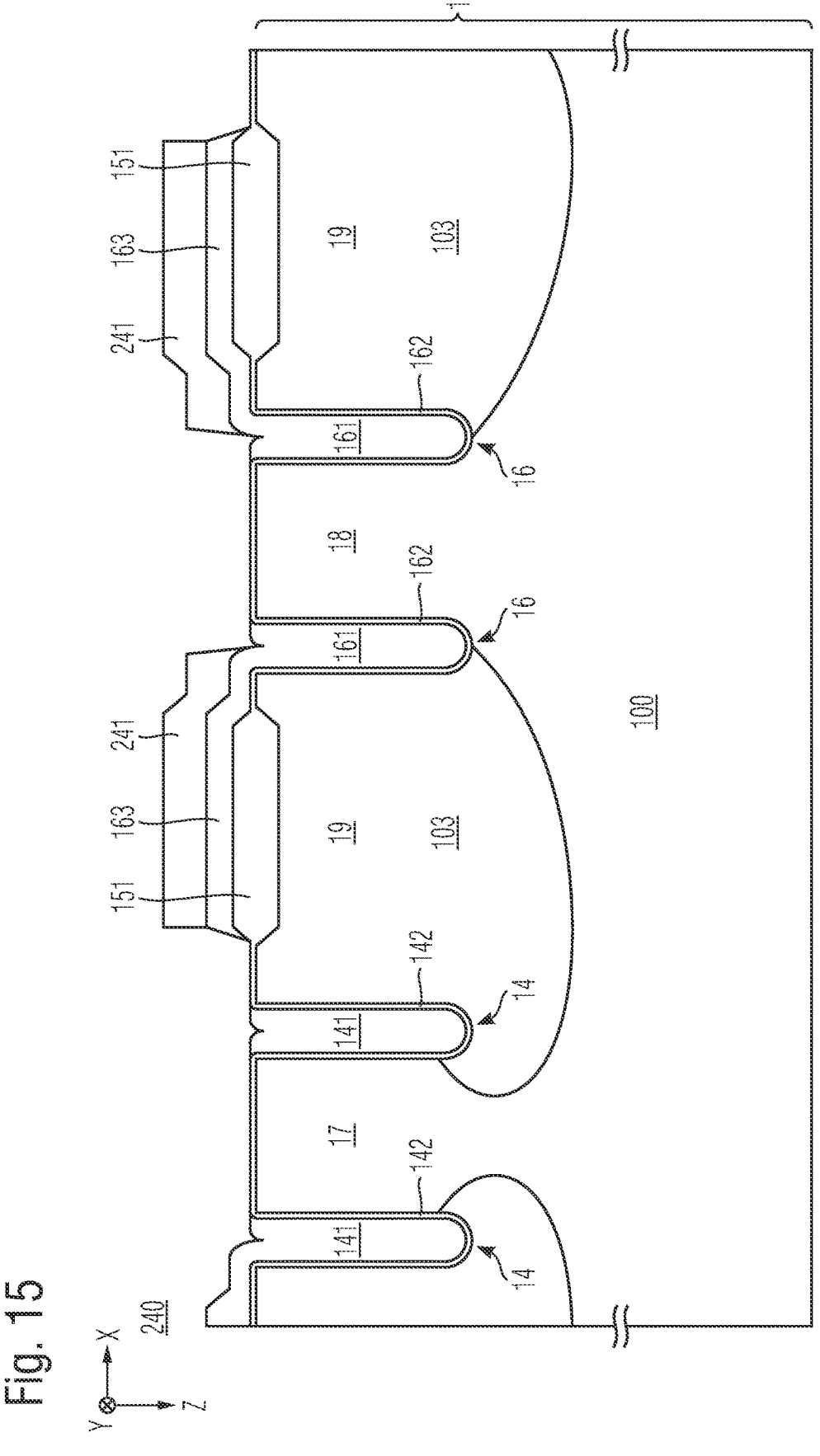
Figure 16:
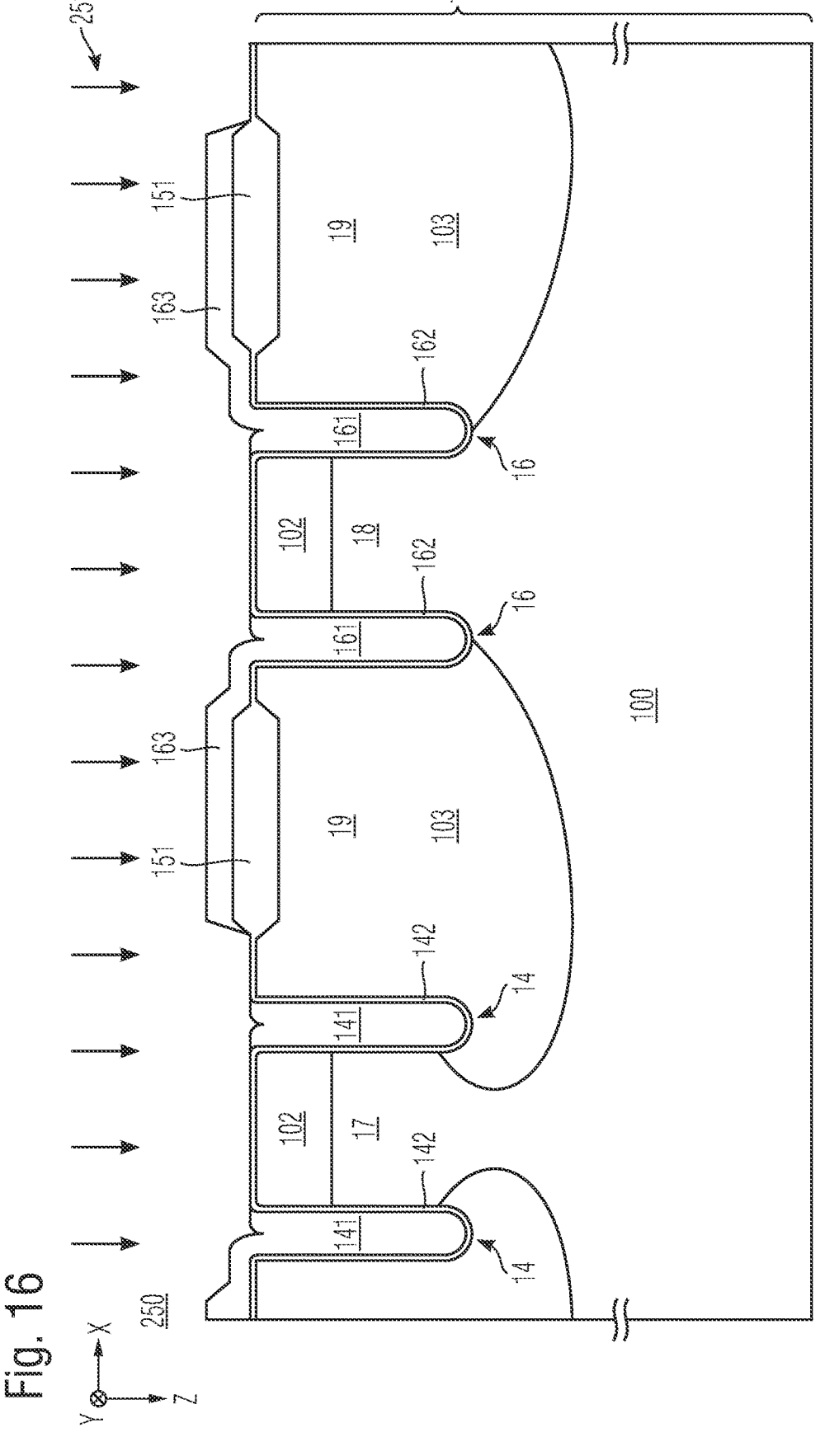
Figure 17:
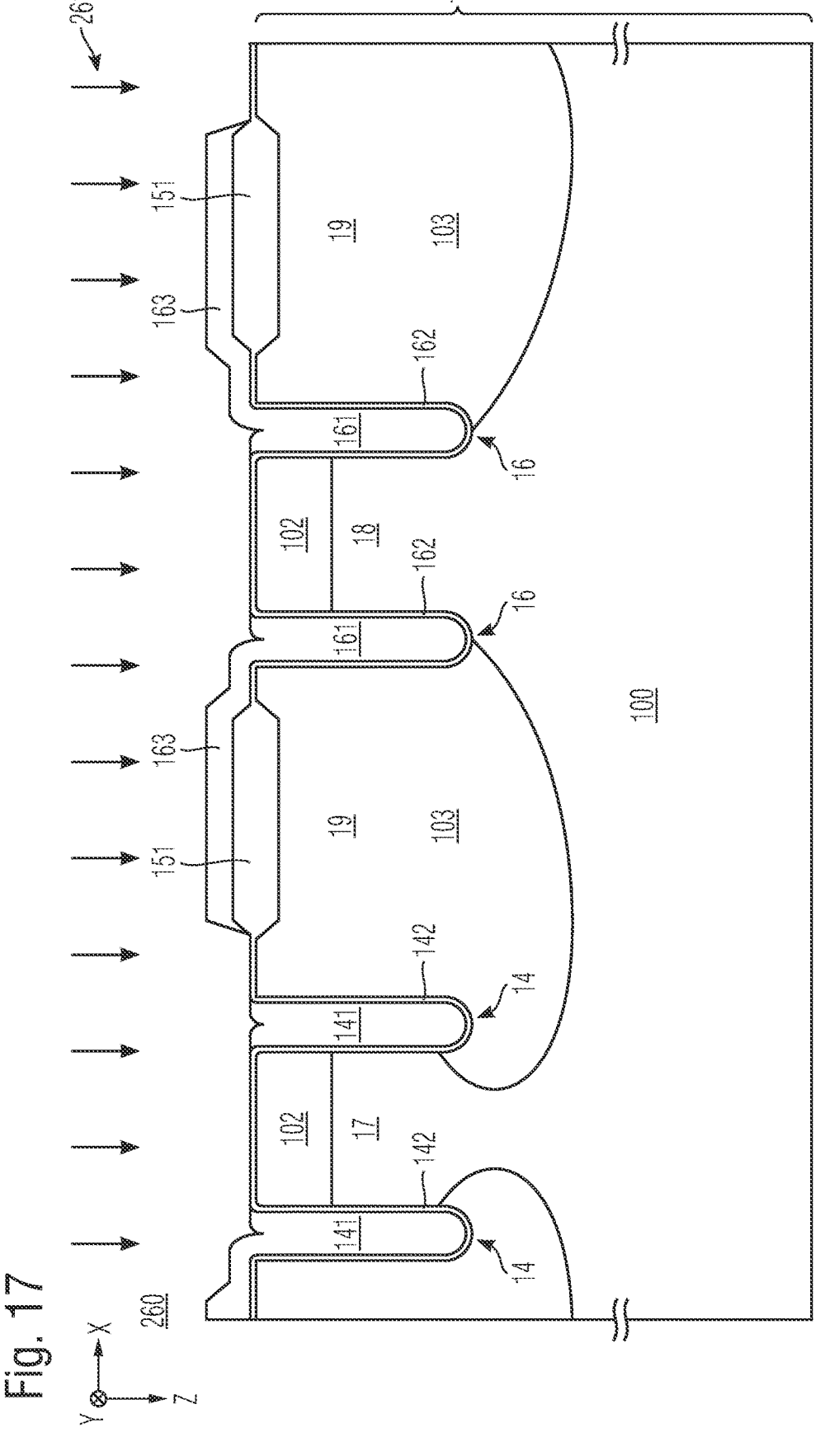
Figure 18:
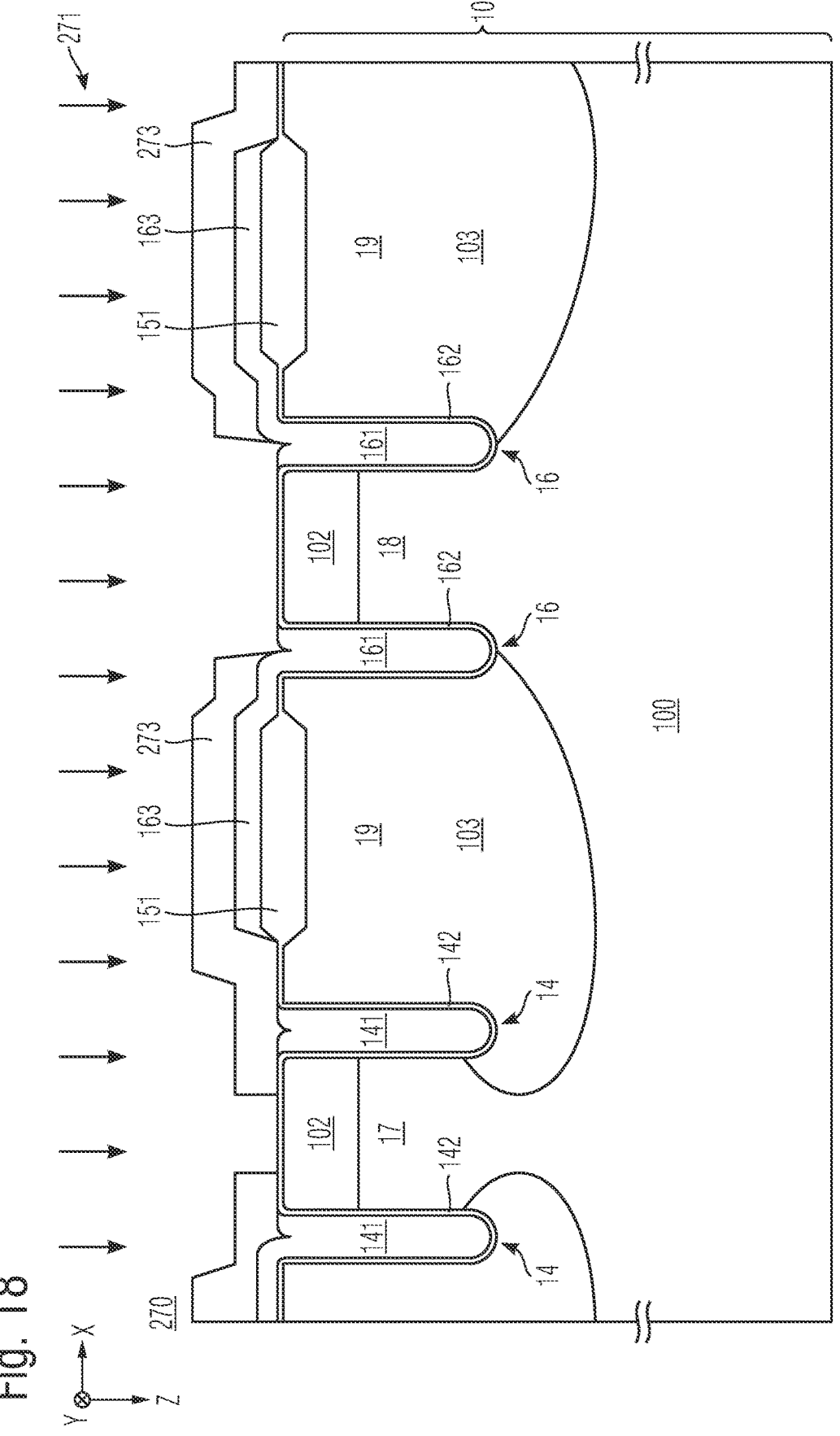
Figure 19:
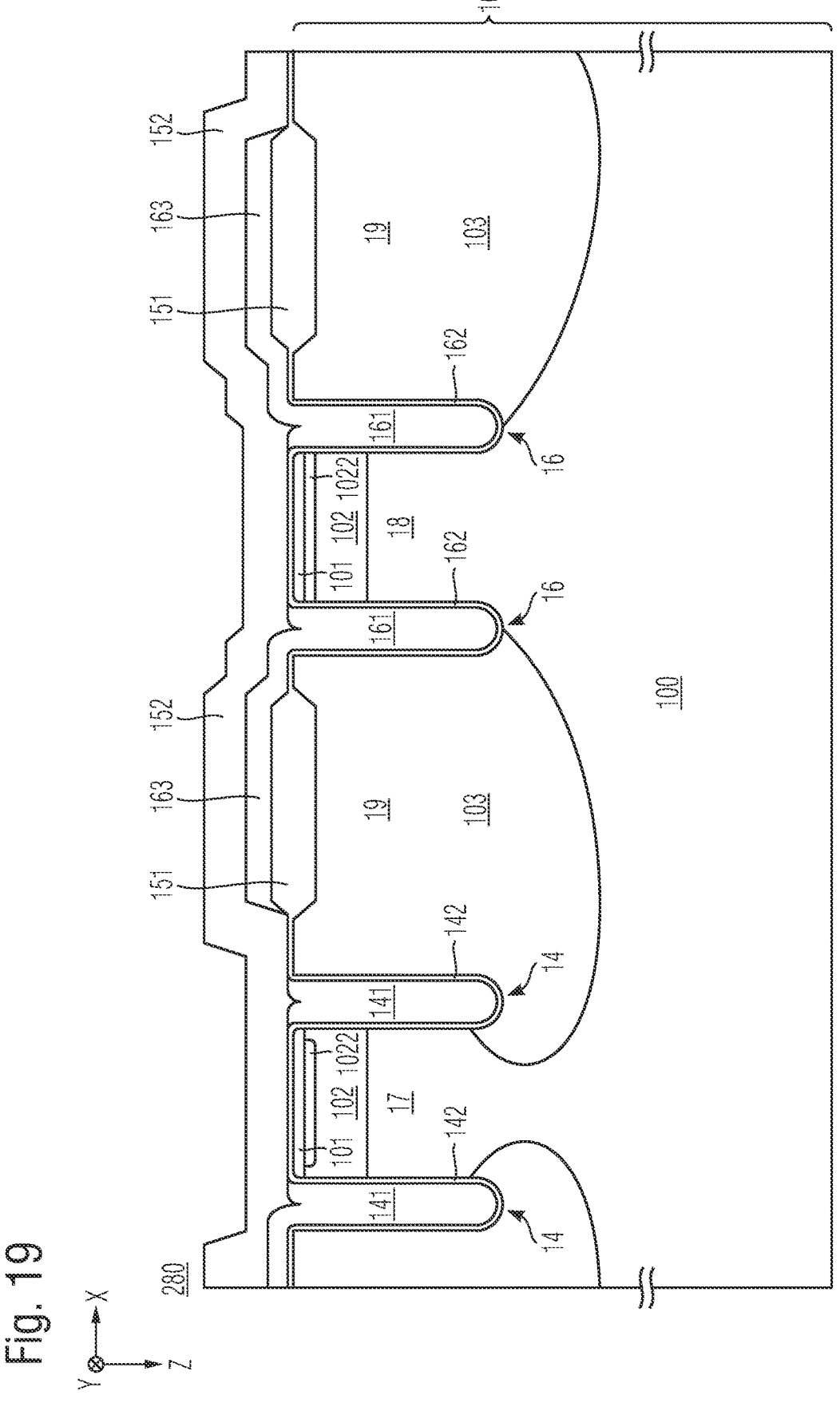
Figure 20:
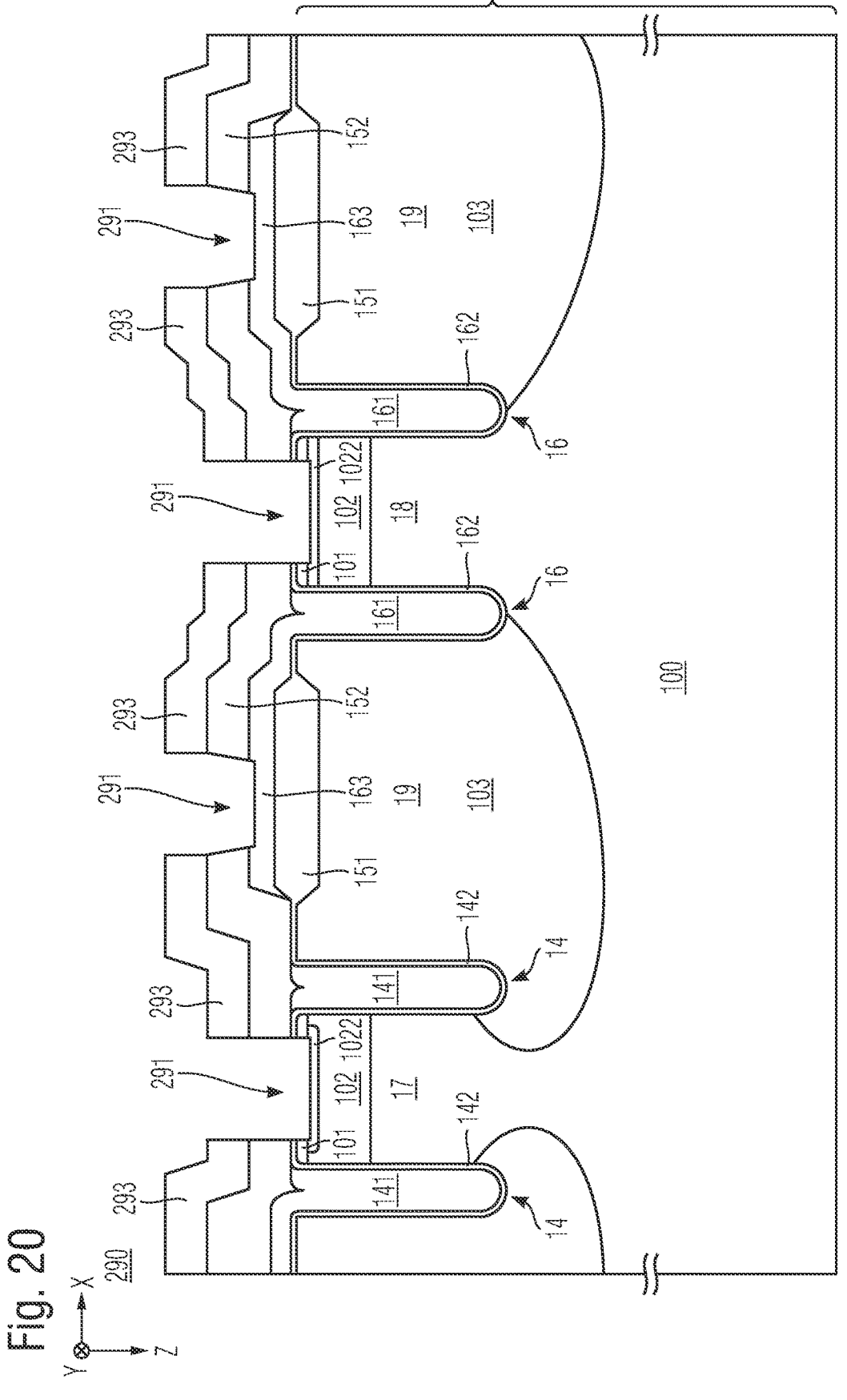
Figure 21:
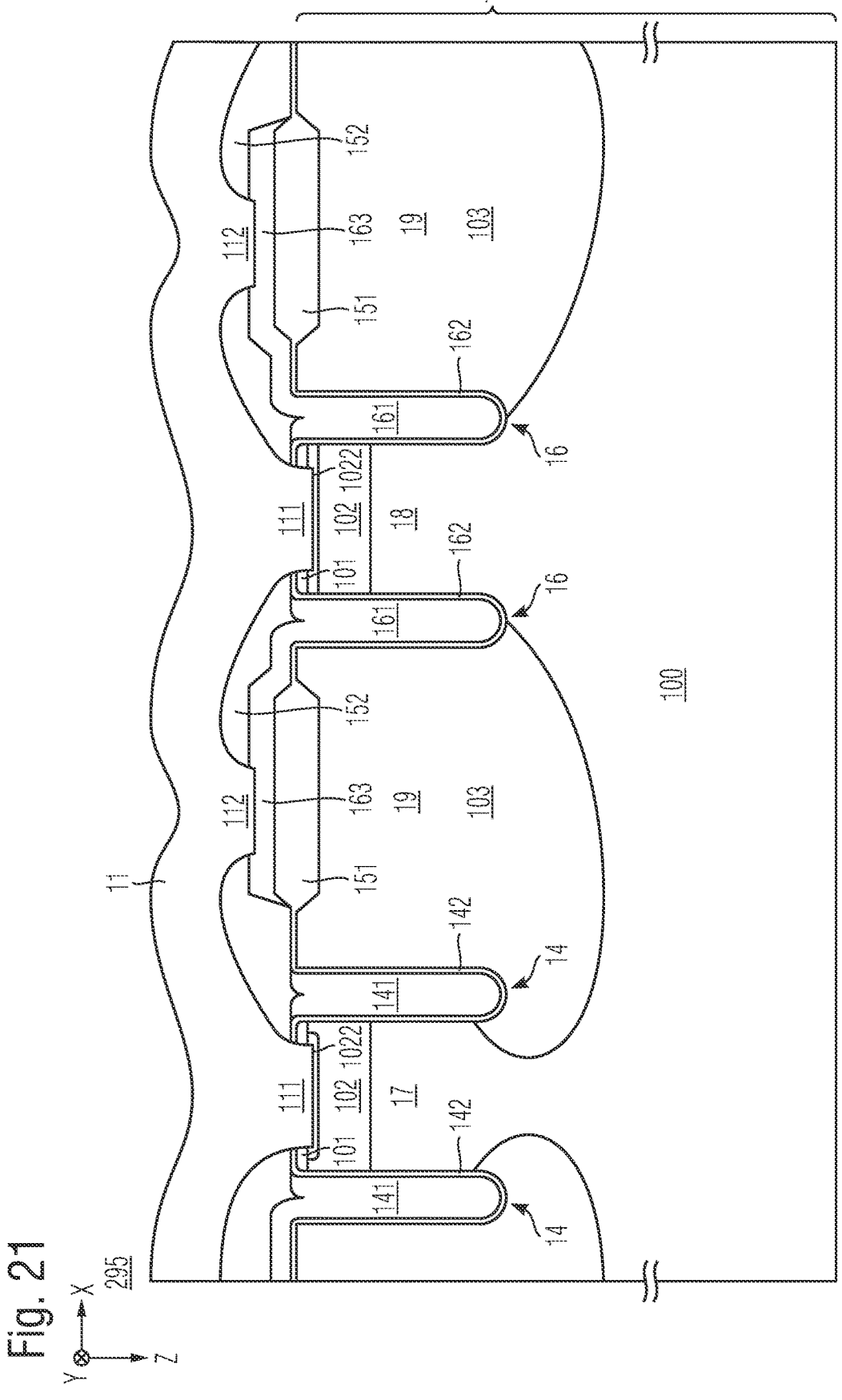

FIGS. 9 and 10 both schematically and exemplarily illustrate a respective section of a vertical cross-section of the power semiconductor device 1 in accordance with one or more embodiments. In both cases, the power semiconductor device 1 may exhibit a stripe configuration which is achieved by stripe like formed trenches 14, 16 that extend, e.g., along the second lateral direction Y for a much greater distance as compared to their respective width along the first lateral direction X. FIG. 9 also illustrates the second side 120 of the power semiconductor device 1, wherein such configuration of the device 1 at its second side 120 may also be present at every other embodiment described herein. Accordingly, the drift region 100 may extend along the vertical direction Z until it adjoins into a field stop layer 108 of the first conductivity type. The field stop layer 108 has a dopant concentration at least ten times as great as the dopant concentration of the drift region 100. The field stop layer 108 has a smaller vertical extension as compared to the drift region 100. A collector region 104 of the second conductivity type is arranged between the field stop layer 108 and the second load terminal 12.

Further, according to FIGS. 9 and 10, dummy mesas 199 may be provided between adjacent second type mesas 18, wherein the dummy mesas 199 are not electrically connected to the first load terminal 11, but separated therefrom, e.g., at least based on the insulation layer 152. For example, in contrast to the first type mesa 17 which is electrically connected to the first load terminal 11, e.g., based on the contact plug 111, there is no electrically conductive connection along the vertical direction Z between the first load terminal 11 and the dummy mesa 199.

In accordance with the embodiment of FIG. 9, the shield region 103 may be provided, e.g., in accordance with the features associated with this shield region 103 as exemplarily described above.

In accordance with the embodiment of FIG. 10, the shield region 103 may be omitted. According to FIG. 10, the power semiconductor device 1 comprises: the first load terminal 11 (not illustrated in FIG. 9) at the first side 110, the second load terminal 12 (not illustrated in FIG. 10) and, coupled to the first load terminal 11 and the second load terminal 12, the semiconductor body 10 configured for conducting the load current between the first load terminal 11 and the second load terminal 12 and having the drift region 100 of the first conductivity type. The plurality of trenches 14, 16 are at the first side 110 and extend into the semiconductor body 10 along the vertical direction Z. Each trench 14, 16 includes its trench electrode 141, 161 insulated from the semiconductor body 10 by the trench insulator 142, 162. Two of the plurality of trenches (e.g. two trenches 14 or one trench 14 and one trench 16) are arranged laterally adjacent to each other and spatially confine the first type mesa 17, wherein the first type mesa 17 is configured for conducting a part of the load current between the first load terminal 11 and the drift region 100. Other two of the plurality of trenches (e.g., two trenches 16 or one trench 14 and one trench 16) are arranged laterally adjacent to each other and spatially confine the second type mesa 18 configured for not conducting an inversion channel current, the second type mesa 18 being arranged spatially separated from the first type mesa 17 and electrically connected with the first load terminal 11. The dummy mesa 199 is laterally confined by yet other two of the plurality of trenches (e.g., two trenches 16) and arranged between two of the second type mesas. The dummy mesa 199 is electrically insulated from the first load terminal 11 and has a lateral width of at least 110% or even of at least 150% of the lateral width of the first type mesa 17. The lateral width of the dummy mesa 199 may optionally not exceed 400% of the lateral width of the first type mesa 17. In another example, the lateral width of the dummy mesa 199 may not exceed 200% of the lateral width of the first type mesa 17. The power semiconductor device 1 further has the source region 101 of the first conductivity type in at least the first type mesa 17, and the body region of the second conductivity type in at least the first type mesa 17, the body region 102 separating the source region 101 from the drift region 100.

Thus, in accordance with the embodiments illustrated in FIGS. 9 and 10, the shield region 103 may or may not be present.

Adjacent second type mesas 18 may be separated from each other based at least on one dummy mesa 199. Due to the thereby increased lateral distance between two second type mesas 18 (in which no inversion channels are induced (e.g., either due to absence of a source region 101 or due to a "blocking" body contact region 1022 (cf. FIG. 3)), the second type mesas 18 do not or, respectively, to a lesser extend contribute to the dynamics of a turn-on operation, but improve/support occurrence of dynamic avalanche during turn-off operation. Optionally, the shield region 103 may be implemented, as illustrated in FIG. 9, again in such a manner that the shield region 103 does not (or, respectively, only partially) laterally overlap with the second type mesa 18, as exemplarily described above.

The considerations regarding the lateral layout of the shield region 103 expressed with respect to FIG. 4, variant (2), FIG. 6, variant (2), and FIG. 8, variant (2) may equally apply to the embodiment illustrated in FIG. 9, where the shield region 103 is optionally implemented.

For example, as illustrated in FIGS. 4, 6 and 8, the power semiconductor device 1 as illustrated in FIG. 9 or 10 may comprise the plurality of equally configured unit cells 1-1, each unit cell 1-1 having a total number of cell-sections 1-10, 1-10', arranged in cellular pattern as in FIGS. 4, 6 and 8, or arranged in accordance with a stripe pattern, as illustrated in FIGS. 9 and 10. In each of at least one or of at most 50% of the unit cells 1-1, a first number of the cell-sections 1-10' may be inactive cell sections, and a second number of the cell sections 1-10 may be active cell sections. The sum of the first number and the second number is equal to the total of the cell sections 1-10, 1-10' of the respective unit cell 1-1, and the ratio between first number to the second number is equal to or smaller than 1/9, 1/100 or even smaller than 1/1000.

As illustrated in FIG. 9 and FIG. 10, two active cell sections 1-10 of the power semiconductor device 1 are for example separated from each other by at least one inactive cell section 1-10', said inactive cell section 1-10' comprising said dummy mesa 199, and each of said active cell sections 1-10 comprising at least one first type mesa 17.

The inactive cell section 1-10' further comprises said second type mesas 18 separated from each other based at least on the dummy mesa 199.

For example, none of the active cell sections 1-10 comprises a second type mesa 18. In the unit cell 1-1, the two active cell sections 1-10 may be arranged so as to laterally flank the inactive cell section 1-10'.

The power semiconductor device 1 presented above may be a trench IGBT. Embodiments of the trench IGBT may also be described as follows:

For example, a trench IGBT 1 comprises the drift region 100 of a first conductivity type; the plurality of trenches 14, 16 laterally confining both the first type mesas 17 having the respective source region 101 and the respective body region 102 and the second type mesas 18. The plurality of trenches 14, 16 extend into an inactive cell section 1-10 and into an active cell section 1-10 of the IGBT 1. Both the inactive cell section 1-10' and the active cell section 1-10 are arranged in the active region of the IGBT 1 and are separated from each other by the at least one spacer region 19. A portion of bottoms of the trenches 14, 16 of the active cell section 1-10 are separated from the drift region by the shield region 103 of the second conductivity type. A portion of bottoms of the trenches of the inactive cell section 1-10' are in direct contact with the drift region 100. This configuration is exemplarily illustrated in FIG. 9. As explained, the shield region 103 may be disposed in the spacer region 19 that separates the inactive cell section 1-10' from the active cell section 1-10. For example, a contact area, formed by the trenches 14, 16 of the active cell section with the drift region 100 is smaller as compared to a contact area that is formed by the trenches 14, 16 of the inactive cell section with the drift region 100. Hence, in the active area, the portion of "exposed trenches" 16 may be larger as compared to the inactive cell section.

According to another example, the trench IGBT 1 comprises: the drift region 100 of a first conductivity type; the plurality of trenches 14, 16 laterally confining both the first type mesas 17 having the respective source region 101 and the respective body region 102 and second type mesas 18. The plurality of trenches 14, 16 extend into the inactive cell section 1-10' and into the active cell section 1-10 of the IGBT 1. Both the inactive cell section 1-10' and the active cell section 1-10 are arranged in the active region of the IGBT 1 and are separated from each other by at least one spacer region 19. The trenches of the active cell section 1-10 do not extend as far towards the drift region 100 as compared to the trenches of the inactive cell section 1-10. This example is not illustrated, but has been explained above with respect to, e.g., FIG. 3; based on the deeper trenches, it can be ensured that the shield region 103 does not laterally overlap with the second type mesa 18.

Furthermore, also with respect to these embodiments of the trench IGBT 1, the trench IGBT may comprise a plurality of equally configured unit cells 1-1, wherein each unit cell may comprise a first number of inactive cell sections 1-10' and a second number of active cell sections 1-10. The active cell section may hence be one of plurality of active cell sections of the IGBT 1 and a ratio of the active cell sections to the inactive cell sections may be more than 4 to 1, more than 10 to 1, or even more than 100 to 1.

Presented herein are also methods of producing a power semiconductor device, such as a trench IGBT.

According to an embodiment, a method of producing a power semiconductor device comprises forming the following components: a first load terminal at a first side, a second load terminal and, coupled to the first load terminal and the second load terminal, a semiconductor body configured for conducting a load current between the first load terminal and the second load terminal and having a drift region of a first conductivity type; a plurality of trenches at the first side and extending into the semiconductor body along a vertical direction. Each trench includes a trench electrode insulated from the semiconductor body by a trench insulator. Two of the plurality of trenches, also referred to as control trenches, are arranged laterally adjacent to each other and spatially confine a first type mesa, wherein the first type mesa is configured for conducting a part of the load current between the first load terminal and the drift region. Other two of the plurality of trenches, also referred to as exposed trenches, are arranged laterally adjacent to each other and spatially confine a second type mesa configured for not conducting an inversion channel current, the second type mesa being arranged spatially separated from the first type mesa by a spacer region. Producing the power semiconductor device further comprises forming: a source region of the first conductivity type in at least the first type mesa; a body region of a second conductivity type in at least the first type mesa, the body region separating the source region from the drift region; separate from the body region, a shield region of the second conductivity type extending: at least partially further along the vertical direction than bottoms of some of the trenches, wherein bottoms of at least the control trenches extend at least partially into the shield region; so as to form at least a partial lateral overlap with the first type mesa said partial overlap with the first type mesa being greater as compared to an overlap with the second type mesa.

According to another embodiment, a method of producing a power semiconductor device comprises forming the following components: a first load terminal at a first side, a second load terminal and, coupled to the first load terminal and the second load terminal, a semiconductor body configured for conducting a load current between the first load terminal and the second load terminal and having a drift region of a first conductivity type; a plurality of trenches at the first side and extending into the semiconductor body along a vertical direction. Each trench includes a trench electrode insulated from the semiconductor body by a trench insulator. Two of the plurality of trenches are arranged laterally adjacent to each other and spatially confine a first type mesa, wherein the first type mesa is configured for conducting a part of the load current between the first load terminal and the drift region. Other two of the plurality of trenches are arranged laterally adjacent to each other and spatially confine a second type mesa configured for not conducting an inversion channel current, the second type mesa being arranged spatially separated from the first type mesa and electrically connected with the first load terminal. A dummy mesa is laterally confined by yet other two of the plurality of trenches and arranged between two of the second type mesas. The dummy mesa is electrically insulated from the first load terminal and has a lateral width of at least 110%, or even of at least 150% of the lateral width of the first type mesa. The lateral width of the dummy mesa may optionally not exceed 400% of the lateral width of the first type mesa. In another example, the lateral width of the dummy mesa may not exceed 200% of the lateral width of the first type mesa. The power semiconductor device further has a source region of the first conductivity type in at least the first type mesa, and a body region of a second conductivity type in at least the first type mesa, the body region separating the source region from the drift region. The second load terminal may be arranged at a second side of the semiconductor body, wherein the second side may be opposite to the first side.

According to another embodiment, a method of producing a trench IGBT comprises forming a drift region of a first conductivity type and a plurality of trenches laterally confining both first type mesas having a respective source region and a respective body region and second type mesas, wherein the plurality of trenches extends into an inactive cell section and into an active cell section of the IGBT. Both the inactive cell section and the active cell section are arranged in an active region of the IGBT and are separated from each other by at least one spacer region. A portion of bottoms of the trenches of the active cell section are separated from the drift region by a shield region of a second conductivity type. A portion of bottoms of the trenches of the inactive cell section are in direct contact with the drift region.

According to another embodiment, a method of producing a trench IGBT comprises forming a drift region of a first conductivity type and a plurality of trenches laterally confining both first type mesas having a respective source region and a respective body region and second type mesas, wherein the plurality of trenches extends into an inactive cell section and into an active cell section of the IGBT. Both the inactive cell section and the active cell section are arranged in an active region of the IGBT and are separated from each other by at least one spacer region. The trenches of the active cell section do not extend as far towards the drift region as compared to the trenches of the inactive cell section.

Further embodiments of these production methods correspond to the exemplary structures of the power semiconductor device 1 described above with respect to the drawings. In so far, it is referred to the above.

Based on FIGS. 11-21, an embodiment of a method of producing a power semiconductor device 1 shall now be described. The described method is for example carried out in order to achieve a structure as illustrated in FIG. 3.

In step 200 (FIG. 11), a resist layer 201 is provided on the first side 110 of the semiconductor body 10. The resist layer 201 has openings 202 exposing the first side 110. The first side 110 is then subjected to an implantation processing step 203. E.g., boron or another suitable material is implanted so as to form the shield region 103.

In step 210 (FIG. 12), the resist layer 201 is removed and insulation blocks 151 (e.g., based on an oxide) are provided at positions corresponding to a lateral shift along the first lateral direction X with respect to the mask openings 202 of the resist layer. Hence, the seed regions 1033 (cf. also FIG. 5) formed by implantation processing step 203 are laterally shifted with respect to the arrangement of the insulation blocks 151. In another embodiment, the seed regions 1033 may be implanted centered relative to the insulation blocks 151.

In step 220 (FIG. 13), trenches 14, 16 are formed that laterally confine portions of the semiconductor body 10 that are herein referred to as mesas. The seed region 1033 is arranged in a mesa that has a greater width as compared to other mesas (said "mesa" being herein referred to as said spacer region 19). As illustrated, due to said lateral shift, the seed region 1033 is positioned asymmetrically and not centrally in the respective mesa. Specifically, the seed region 1033 is arranged at a closer distance to one of the two trenches confining the mesa as compared to the other one of the two trenches. In the above mentioned another embodiment, an asymmetrical formation of the shield region 103 may be enabled by an additional counter doping of the shield region 103 through the trench bottoms, for example after or during step 220 and prior to step 230.

In step 230 (FIG. 14), the trench formation process is continued after a diffusion processing step has been carried out according to which a dopant material of the seed region 1033 has diffused to form the shield region 103. The shield region 103 overlaps with the first type mesa 17 and does, in the illustrated example, not overlap with the second type mesa 18. Furthermore, the trench insulators 142, 162 are formed (e.g., by a gate oxidation processing step) and the trenches 14, 16 are filled with an electrically conductive material 143, 163 (e.g., based on a poly-silicon deposition processing step) so as to form the trench electrodes 141, 161.

In step 240 (FIG. 15), the electrically conductive material 143, 163 is structured by partially removing the electrically conductive material 143, 163, e.g., based on a further resist layer 241 and an etch processing step.

In step 250 (FIG. 16), the further resist layer 241 is removed and an implantation processing step 251 and a subsequent diffusion processing step are carried out so as to form the body regions 102 in both the first type mesa 17 and the second type mesa 18.

In step 260 (FIG. 17), a further implantation processing step 261 is carried out so as to form the source regions 101 in both the first type mesa 17 and the second type mesa 18.

In step 270 (FIG. 18), a yet further implantation processing step 271 is carried out after having provided a yet further resist layer 273 so as to form the body contact regions 1022 in both the first type mesa 17 and the second type mesa 18. As illustrated, the resist layer 273 is structured such that the first type mesa 17 is only partially exposed, whereas the second type mesa 18 is fully exposed. Thus—as has been described above (e.g., with respect to FIG. 3), the source region 101 in the second type mesa 18 will be fully covered by the body contact region 1022, such that induction of the inversion channel in the second type mesa 18 is not possible. Additionally or alternatively, the source region 101 may be omitted in the second type mesa 18, e.g., be providing a correspondingly structured mask.

In step 280 (FIG. 19), one or more diffusion processing steps are carried out so as to finalize formation of the source region 101 and the body contact regions 1022. Furthermore, an insulation layer 152 is formed, e.g., based on depositing an electrically insulating material, such as BPSG (Borophosphosilicate Glass).

In step 290 (FIG. 20), a yet further resist layer 293 is provided. The openings of the resist layer 293 correspond to positions where the contact plugs 111, 112 are to be formed. One or more etch processing steps may be carried out to form contact grooves 291.

In step 295 (FIG. 21), an electrically conductive material is deposited to form the first load terminal 11 and the contact plugs 111, 112 in the contact grooves 291, e.g., after the insulation layer 152 has been subjected to a rounding processing step.

In the above, embodiments pertaining to power semiconductor device, such as MOSFETs, IGBTs, RC IGBTs and derivatives thereof, and corresponding processing methods were explained. For example, these power semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
    a first load terminal at a first side, a second load terminal and, coupled to the first load terminal and the second load terminal, a semiconductor body configured to conduct a load current between the first load terminal and the second load terminal and having a drift region of a first conductivity type;

a plurality of trenches at the first side and extending into the semiconductor body along a vertical direction, wherein each trench includes a trench electrode insulated from the semiconductor body by a trench insulator, wherein two of the plurality of trenches are arranged laterally adjacent to each other and spatially confine a first type mesa, wherein the first type mesa is configured to conduct a part of the load current between the first load terminal and the drift region, wherein other two of the plurality of trenches are arranged laterally adjacent to each other and spatially confine a second type mesa configured to not conduct an inversion channel current, the second type mesa being arranged spatially separated from the first type mesa and electrically connected with the first load terminal, wherein a dummy mesa is laterally confined by yet other two of the plurality of trenches and arranged between two of the second type mesas, the dummy mesa being electrically insulated from the first load terminal and having a lateral width of at least 110% of the lateral width of the first type mesa;

a source region of the first conductivity type in at least the first type mesa;

a body region of a second conductivity type in at least the first type mesa, the body region separating the source region from the drift region.

2. The power semiconductor device of claim 1, wherein two active cell sections of the power semiconductor device are separated from each other by at least one inactive cell section, the inactive cell section comprising the dummy mesa, and each of the active cell sections comprising at least one first type mesa.

3. The power semiconductor device of claim 2, wherein the inactive cell section further comprises the second type mesas separated from each other based at least on the dummy mesa.

4. The power semiconductor device of claim 2, wherein none of the active cell sections comprises a second type mesa.

5. The power semiconductor device of claim 2, wherein the two active cell sections are arranged so as to laterally flank the inactive cell section.

6. The power semiconductor device of claim 1, wherein the source region and the body region in the first type mesa are electrically connected to the first load terminal.

7. The power semiconductor device of claim 1, wherein a second conductivity type region is in the second type mesa and electrically connected to the first load terminal.

8. A trench IGBT, comprising:

a drift region of a first conductivity type;

a plurality of trenches laterally confining both first type mesas having a respective source region and a respective body region and second type mesas, the plurality of trenches extending into an inactive cell section and into an active cell section of the IGBT, wherein both the inactive cell section and the active cell section are arranged in an active region of the IGBT and are separated from each other by at least one spacer region, wherein a portion of bottoms of the trenches of the active cell section are separated from the drift region by a shield region of a second conductivity type, wherein a portion of bottoms of the trenches of the inactive cell section are in direct contact with the drift region.

9. The trench IGBT of claim 8, wherein the shield region is disposed in the spacer region that separates the inactive cell section from the active cell section.

10. The trench IGBT of claim 8, wherein the active cell section is one of plurality of active cell sections of the IGBT, and wherein a ratio of the active cell sections to the inactive cell sections is more than 4 to 1.

11. The trench IGBT of claim 8, wherein a first portion of the bottoms of the trenches of the active cell section are separated from the drift region by the shield region, and wherein a second portion of the bottoms of the trenches of the active cell section are in direct contact with the drift region.

12. The trench IGBT of claim 8, wherein the spacer region is entirely filled with the shield region.

* * * * *